United States Patent
Miyamoto et al.

(10) Patent No.: US 8,981,434 B2
(45) Date of Patent: Mar. 17, 2015

(54) SEMICONDUCTOR DEVICE AND FIELD EFFECT TRANSISTOR

(75) Inventors: Hironobu Miyamoto, Minato-ku (JP); Yasuhiro Okamoto, Minato-ku (JP); Yuji Ando, Minato-ku (JP); Tatsuo Nakayama, Minato-ku (JP); Takashi Inoue, Minato-ku (JP); Kazuki Ota, Minato-ku (JP); Kazuomi Endo, Minato-ku (JP)

(73) Assignee: Renesas Electronics Corporation, Kanagawa (JP)

( * ) Notice: Subject to any disclaimer, the term of this patent is extended or adjusted under 35 U.S.C. 154(b) by 476 days.

(21) Appl. No.: 13/393,002
(22) PCT Filed: Jun. 23, 2010
(86) PCT No.: PCT/JP2010/060637
§ 371 (c)(1), (2), (4) Date: Apr. 19, 2012
(87) PCT Pub. No.: WO2011/024549
PCT Pub. Date: Mar. 3, 2011

(65) Prior Publication Data
US 2012/0199889 A1    Aug. 9, 2012
US 2013/0113028 A2    May 9, 2013

(30) Foreign Application Priority Data
Aug. 31, 2009 (JP) ................. 2009-201140

(51) Int. Cl.
*H01L 29/76* (2006.01)
*H01L 29/812* (2006.01)
(Continued)

(52) U.S. Cl.
CPC .......... *H01L 29/8122* (2013.01); *H01L 29/201* (2013.01); *H01L 29/7809* (2013.01);
(Continued)

(58) Field of Classification Search
USPC ...................... 257/76, 77, 192, 288
See application file for complete search history.

(56) References Cited

U.S. PATENT DOCUMENTS 6,239,463 B1    5/2001  Williams et al.
(Continued)

FOREIGN PATENT DOCUMENTS

JP    2003-59938 A    2/2003
(Continued)

OTHER PUBLICATIONS

Japanese Office Action issued Apr. 15, 2014 in corresponding Japanese Patent Application No. 2011-528691.
(Continued)

*Primary Examiner* — Errol Fernandes
(74) *Attorney, Agent, or Firm* — Sughrue Mion, PLLC

(57) ABSTRACT

Provided is a semiconductor device in which the trade-off between the withstand voltage and the on-resistance is improved and the performance is increased. A semiconductor device comprises a substrate 1, a first n-type semiconductor layer 21', a second n-type semiconductor layer 23, a p-type semiconductor layer 24, and a third n-type semiconductor layer 25', wherein the first n-type semiconductor layer 21', the second n-type semiconductor layer 23, the p-type semiconductor layer 24, and the third n-type semiconductor layer 25' are laminated at the upper side of the substrate 1 in this order. The drain electrode 13 is in ohmic-contact with the first n-type semiconductor layer 21' and the source electrode 12 is in ohmic-contact with the third n-type semiconductor layer 25'. A gate electrode 14 is arranged so as to fill an opening portion to be filled that extends from the third n-type semiconductor layer 25' to the second n-type semiconductor layer 23, and the gate electrode 14 is in contact with the upper surface of the second n-type semiconductor layer 23, the side surfaces of the p-type semiconductor layer 24, and the side surfaces of the third n-type semiconductor layer 25'. The second n-type semiconductor layer 23 has composition that changes from the drain electrode 13 side toward the source electrode 12 side in the direction perpendicular to the plane of the substrate 1 and contains donor impurity.

17 Claims, 9 Drawing Sheets

(51) Int. Cl.
  *H01L 29/201* (2006.01)
  *H01L 29/78* (2006.01)
  *H01L 29/06* (2006.01)
  *H01L 29/20* (2006.01)
  *H01L 29/205* (2006.01)
  *H01L 29/417* (2006.01)
  *H01L 29/423* (2006.01)

(52) U.S. Cl.
  CPC ........ *H01L29/7812* (2013.01); *H01L 29/7813* (2013.01); *H01L 29/8128* (2013.01); *H01L 29/0657* (2013.01); *H01L 29/2003* (2013.01); *H01L 29/205* (2013.01); *H01L 29/41741* (2013.01); *H01L 29/41766* (2013.01); *H01L 29/4236* (2013.01)
  USPC .............................. 257/288; 257/76; 257/192

(56) References Cited

U.S. PATENT DOCUMENTS

| | | | |
|---|---|---|---|
| 8,426,895 B2* | 4/2013 | Okamoto et al. | 257/219 |
| 8,659,055 B2* | 2/2014 | Okamoto et al. | 257/194 |
| 2002/0195619 A1 | 12/2002 | Makimoto et al. | |
| 2005/0167742 A1 | 8/2005 | Challa et al. | |
| 2009/0321854 A1 | 12/2009 | Ohta et al. | |
| 2010/0327318 A1* | 12/2010 | Okamoto et al. | 257/192 |
| 2012/0153355 A1* | 6/2012 | Umeda et al. | 257/192 |
| 2012/0228674 A1* | 9/2012 | Okamoto et al. | 257/192 |

FOREIGN PATENT DOCUMENTS

| | | |
|---|---|---|
| JP | 2008-78604 A | 2/2003 |
| JP | 2004-289005 A | 10/2004 |
| JP | 2008-205199 A | 9/2008 |
| JP | 2008-227514 A | 9/2008 |
| WO | WO 2008/023738 A1 | 2/2008 |
| WO | WO 2010/073871 A1 | 7/2010 |

OTHER PUBLICATIONS

International Search Report for PCT/JP2010/060637 dated Sep. 21, 2010.

O. Ambacher et al., Pyroelectric properties of Al(In)GaN/GaN hetero- and quantum well structures.

* cited by examiner

SEMICONDUCTOR DEVICE AND FIELD EFFECT TRANSISTOR

CROSS REFERENCE TO RELATED APPLICATIONS

This application is a National Stage of International Application No. PCT/JP2010/060637 filed Jun. 23, 2010, claiming priority based on Japanese Patent Application No. 2009-201140 filed Aug. 31, 2009, the contents of all of which are incorporated herein by reference in their entirety.

TECHNICAL FIELD

The present invention relates to semiconductor devices and field effect transistors.

BACKGROUND ART

Among semiconductor devices, field effect transistors are applied widely to various electronic devices, and various researches have been conducted into the field effect transistors (for example, Patent Documents 1 to 3). From the viewpoint of the performance increase and the cost reduction of various electronic devices, various researches have been conducted into properties of semiconductor devices such as field effect transistors and the like from the aspects of both theory and practical use.

RELATED ART DOCUMENT

Patent Document

[Patent Document 1] JP 2004-289005 A
[Patent Document 2] JP 2008-78604 A
[Patent Document 3] JP 2008-205199 A

SUMMARY OF INVENTION

Problem to be Solved by the Invention

FIG. 8 is a cross sectional view schematically showing an example of the structure of a field effect transistor. As shown in FIG. 8, in this field effect transistor, an n-type buffer layer 20 is laminated on the upper surface of a sapphire substrate 1. Further, on the upper surface of the n-type buffer layer 20, an AlGaN buffer layer 21 and a high concentration n-type AlGaN layer 22 are laminated in this order. On a part of the upper surface of the high concentration n-type AlGaN layer 22, an n-type AlGaN layer 23, a p-type GaN layer 24, an n-type GaN layer 25, and a high concentration n-type GaN layer 26 are laminated in this order. On parts of the upper surface of the high concentration n-type AlGaN layer 22 where the aforementioned layers are not laminated, drain electrodes 13 that are in ohmic-contact with the high concentration n-type AlGaN layer 22 are formed. A part of the n-type AlGaN layer 23, a part of the p-type GaN layer 24, a part of the n-type GaN layer 25, and a part of the high concentration n-type GaN layer 26 are removed by etching or the like to form an opening portion to be filled that extends from the upper surface of the high concentration n-type GaN layer 26 to the upper part of the n-type AlGaN layer 23. The opening portion to be filled is filled with the gate electrode 14 via a gate insulation film 15. The gate electrode 14 forms a metal/insulation film/semiconductor (MIS) structure with the n-type AlGaN layer 23, the p-type GaN layer 24, and the n-type GaN layer 25 via the gate insulation film 15. On the parts of the upper surface of the high concentration n-type GaN layer 26 where the gate insulation film 15 and the gate electrode 14 are not formed, source electrodes 12 that are in ohmic-contact with the high concentration n-type GaN layer 26 are formed. This field effect transistor is a vertical transistor in which current passes from bottom to top in FIG. 8.

Among semiconductor device properties, a withstand voltage and an on-resistance are important properties. Hereinafter, the relationship between the withstand voltage and the on-resistance of a semiconductor device will be described with theoretical equations with reference to the field effect transistor shown in FIG. 8 as an example.

First, in the field effect transistor of FIG. 8, a maximum value $E_{max}$ (V/m) of the electric field intensity at the interface between the n-type semiconductor layer 23 and the p-type semiconductor layer 24 is expressed by the following Equation (1).

[Equation 1]

$$E_{max} = \frac{2(V_{bi} - V - kT/q)}{W} \quad (1)$$

In the Equation (1), the meanings of the symbols are as follows:

Vbi: built-in-potential (V)
k: Boltzmann constant (J/K)
T: temperature (K)
q: elementary charge (elementary electric charge) (C)
W: depletion layer width (m) at n-type semiconductor layer side Further, the depletion layer width W at the n-type semiconductor layer side in the Equation (1) can be expressed by the following Equation (2).

[Equation 2]

$$W = \sqrt{\frac{2\varepsilon_s}{qN_D}\left(V_{bi} - V - \frac{kT}{q}\right)} \quad (2)$$

In the Equation (2), the meanings of the symbols are as follows:

$\varepsilon_s$: permittivity (F/m)
$N_D$: donor concentration (m$^{-3}$)

The following Equation (3) can be derived from the Equations (1) and (2).

[Equation 3]

$$|V| = \frac{\varepsilon_s E_{max}^2}{2qN_D} - V_{bi} + \frac{kT}{q} \quad (3)$$

When a maximum value $E_{max}$ of the electric field intensity reaches the insulation breakdown electric field $E_{crit}$ (V/m) of the semiconductor, a breakdown is caused. Therefore, the withstand voltage $V_B$ (V) of a vertical transistor is expressed by the following Equation (4).

[Equation 4]

$$V_B = \frac{\varepsilon_s E_{crit}^2}{2qN_D} - V_{bi} + \frac{kT}{q} \quad (4)$$

In other words, the withstand voltage $V_B$ of the vertical transistor shown in FIG. 8 depends on the impurity concentration $N_D$ of the n-type AlGaN layer. It is to be noted that the aforementioned relationship holds for the condition in which a depletion layer is sufficiently stretched in a semiconductor layer (i.e., the condition in which the semiconductor has the thickness where a neutral region can be present). When the thickness of the semiconductor at this time is defined as $d_{min}$ (m), since $d_{min}$ is equal to the depletion layer width of the n-type semiconductor layer in the condition where the semiconductor reaches the insulation breakdown electric field, the following Equation (5) can be derived from the Equations (1) and (2).

[Equation 5]

$$d_{min} = \frac{\varepsilon_s E_{crit}}{qN_D} \quad (5)$$

On the other hand, the on-resistance $R_{on}$ ($\Omega \cdot m^2$), which is an important indicator of performance of the vertical transistor along with the withstand voltage, is expressed by the following Equation (6).

[Equation 6]

$$R_{on} = \frac{d}{qn\mu} \quad (6)$$

In the Equation (6), the meanings of the symbols are as follows:
μ: mobility ($m^2/V \cdot s$)
n: carrier concentration ($m^{-3}$)

Since it can be considered that the carrier concentration n is subequal to the impurity concentration $N_D$, on the basis of the Equations (5) and (6), a minimum value of the on-resistance is expressed by the following Equation (7).

[Equation 7]

$$R_{on} = \frac{\varepsilon_s E_{crit}}{q^2 N_D^2 \mu} \quad (7)$$

Here, when the approximation of $V_B \gg |V_{bi} - kT/q|$ is used, the relationship of the following Equation (8) can be derived from the Equations (4) and (7) between the withstand voltage and the on-state resistance.

[Equation 8]

$$R_{on} = \frac{4V_B^2}{\varepsilon_s \mu E_{crit}^3} \quad (8)$$

As indicated by the Equation (8), there is the trade-off between the withstand voltage and the on-resistance such that the on-resistance $R_{on}$ also increases to achieve the vertical transistor having a high withstand voltage $V_B$. Further, since the foregoing relationship depends on the physical properties such as the permittivity, the mobility, and the insulation breakdown electric field of the semiconductor layer ($Al_xGa_{1-x}N$ in FIG. 8), the increase in performance by the improvement of the trade-off is very difficult. Further, the Equations (1) to (8) apply not only to the transistor but also to the semiconductor devices in general. Therefore, the foregoing problem is a common problem among the semiconductor devices in general.

Hence, the present invention is intended to provide a semiconductor device in which the trade-off between the withstand voltage and the on-resistance is improved and the performance is increased.

Means for Solving Problem

In order to achieve the aforementioned object, the semiconductor device of the present invention comprises:
a substrate;
a first n-type semiconductor layer;
a second n-type semiconductor layer;
a p-type semiconductor layer;
a third n-type semiconductor layer;
a drain electrode;
a source electrode; and
a gate electrode, wherein
the first n-type semiconductor layer, the second n-type semiconductor layer, the p-type semiconductor layer, and the third n-type semiconductor layer are laminated at the upper side of the substrate in this order,
the drain electrode is in ohmic-contact with the first n-type semiconductor layer directly or via the substrate,
the source electrode is in ohmic-contact with the third n-type semiconductor layer,
an opening portion to be filled that extends from an upper surface of the third n-type semiconductor layer to an upper part of the second n-type semiconductor layer is formed at a part of the p-type semiconductor layer and a part of the third n-type semiconductor layer,
the gate electrode is arranged so as to fill the opening portion to be filled and is in contact with an upper surface of the second n-type semiconductor layer, side surfaces of the p-type semiconductor layer, and side surfaces of the third n-type semiconductor layer at inner surfaces of the opening portion to be filled, and
the second n-type semiconductor layer has composition that changes from a drain electrode side toward a source electrode side in a direction perpendicular to a plane of the substrate and contains donor impurity.

Effects of the Invention

According to the present invention, a semiconductor device in which the trade-off between the withstand voltage and the on-resistance is improved and the performance is increased can be provided.

DESCRIPTION OF EMBODIMENTS

According to the semiconductor device of the present invention, at the time of application of a voltage between the source electrode and the drain electrode, the electric field concentration can be relieved by neutralizing (cancelling) a positive charge that is generated in the second n-type semiconductor layer due to donor impurity by a negative polarization charge that is generated in the second n-type semiconductor layer. Thereby, the trade-off between the withstand voltage and the on-resistance can be improved.

Hereinafter, the semiconductor device of the present invention will be described in detail. However, the present invention is not limited to the following embodiments.

Embodiment 1

Figure 1A:
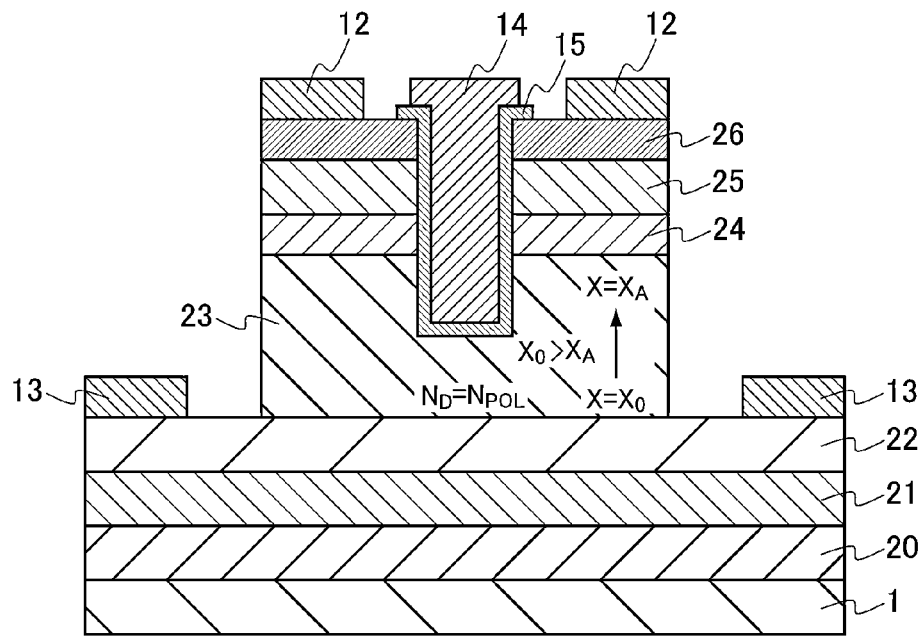
FIG. 1A is a cross sectional view showing an example of the structure of the vertical transistor of Embodiment 1.

FIG. 1A is a cross sectional view showing an example of the structure of the semiconductor device of the present embodiment. This semiconductor device is a vertical field effect transistor (in the present invention, this may be simply referred to as a "vertical transistor") that has semiconductor layers each formed of a III-nitride semiconductor and allows a current to be passed in the direction perpendicular to the semiconductor layers. As shown in FIG. 1A, this vertical transistor is formed at the upper side of a substrate 1 such as sapphire. On the upper surface of the substrate 1, a buffer layer 20 is formed. Further, on the upper surface of the buffer layer 20, an AlGaN buffer layer 21 and a high concentration n-type AlGaN layer 22 grown on Ga-face are laminated in this order. On a part of the upper surface of the high concentration n-type AlGaN layer 22, an n-type $Al_yGa_{1-y}N$ layer 23, a p-type GaN layer 24, an n-type GaN layer 25, and a high concentration n-type GaN layer 26 are laminated in this order. On the parts of the upper surface of the high concentration n-type AlGaN layer 22 where the aforementioned layers are not laminated, drain electrodes 13 that are in ohmic-contact with the high concentration n-type AlGaN layer 22 are formed. A part of the n-type $Al_yGa_{1-y}N$ layer 23, a part of the p-type GaN layer 24, a part of the n-type GaN layer 25, and a part of the high concentration n-type GaN layer 26 are removed by etching or the like to form an opening portion to be filled that extends from the upper surface of the high concentration n-type GaN layer 26 to the upper part of the n-type $Al_yGa_{1-y}N$ layer 23. The opening portion to be filled is filled with the gate electrode 14 via a gate insulation film 15. The gate electrode 14 is in contact with the upper surface of the n-type $Al_yGa_{1-y}N$ layer 23, the side surfaces of the p-type GaN layer 24, the side surfaces of the n-type GaN layer 25, and the side surfaces of the high concentration n-type GaN layer 26 at the inner surfaces of the opening portion to be filled via the gate insulation film 15, and thereby forms a so-called MIS electrode structure. On the parts of the upper surface of the high concentration n-type GaN layer 26 where the gate insulation film 15 and the gate electrode 14 are not formed, source electrodes 12 that are in ohmic-contact with the high concentration n-type GaN layer 26 are formed. The Al composition ratio x of the $Al_xGa_{1-x}N$ layer 23 decreases from the drain electrode side toward the source electrode side. Here, the AlGaN buffer layer 21 and the high concentration n-type AlGaN layer 22 grown on Ga-face each correspond to the "first n-type semiconductor layer". The $Al_xGa_{1-x}N$ layer 23 corresponds to the "second n-type semiconductor layer". The p-type GaN layer 24 corresponds to the "p-type semiconductor layer". The n-type GaN layer 25 and the high concentration n-type GaN layer 26 each correspond to the "third n-type semiconductor layer".

Note here that in the present invention, unless otherwise noted, "at the upper side" is not limited to a state where a first component is directly in contact with the upper surface of a second component (on) but may include a state where another component is present between two components, i.e., a state where the first component is not directly in contact with the upper surface of the second component (above). Similarly, unless otherwise noted, "at the lower side" may include a state where a first component is directly in contact with the lower surface of a second component (on) or a state where another component is present between two components, i.e., a state where the first component is not directly in contact with the lower surface of the second component (below). Further, "on the upper surface" indicates a state where a first component is directly in contact with the upper surface of a second component. Similarly, "on the lower surface" indicates a state where a first component is directly in contact with the lower surface of a second component. Unless otherwise noted, "at the one side" may include a state where a first component is directly in contact with the one side of a second component or a state where another component is present between two components, i.e., a state where the first component is not directly in contact with the one side of the second component. The same applies to "at the both sides". "On the one side" indicates a state where a first component is directly in contact with the one side of a second component. The same applies to "on the both sides".

Hereinafter, the withstand voltage and the on-resistance of the vertical field effect transistor of the foregoing configuration will be described. However, the following descriptions, numerical values, and the like are merely illustrative and do not limit the present invention. Further, in the present invention, in the case where the present invention is specified by numerical limitations, it may be strictly specified by the numerical value or may be roughly specified by the numerical value. Further, the Equations are just theoretical equations and actual behaviors of the semiconductor device of the present invention may not fully agree with the Equations.

First, in the vertical field effect transistor of FIG. 1A, the Al composition ratios of the AlGaN buffer layer 21, the high concentration n-type AlGaN layer 22, and the lowest part of the n-type AlGaN layer 23 agree with one another, and the value thereof is defined as $x_0$. Here, the Al composition ratio of the uppermost part of the n-type $Al_xGa_{1-x}N$ layer 23 is defined as $x_A$, and it is assumed that composition changes from the lowest part toward the uppermost part in K stages (K is an integer more than 2). When the value K is sufficiently large, it can be considered that the composition change is continuous. Hereinafter, the Al composition ratio of the layer at the $k^{th}$ in the n-type $Al_xGa_{1-x}N$ layer 23 is defined as $x_k$ (k is an integer from 0 to K, k=0 represents the interface between the n-type $Al_xGa_{1-x}N$ layer 23 and the n-type AlGaN layer 22). Here, in the present invention, the "composition" represents the quantitative relationship of the number of atoms of elements that configure a semiconductor layer or the like. The "composition ratio" represents the relative ratio between the number of atoms of specific elements that configure the semiconductor layer or the like and the number of atoms of other elements. For example, in the $Al_xGa_{1-x}N$, the numerical value of x is referred to as a "Al composition ratio".

According to O. Ambacher, et al., "*Pyroelectric properties of Al(In)GaN/GaN hetero- and quantum well structures,*" *Journal of Physics: Condensed Matter*, Vol. 14, pp. 3399-3434 (2002), the spontaneous polarization charge $P_{SP}$ that is generated in the AlGaN having an Al composition ratio $x_k$ is expressed by the following Equation (9).

[Equation 9]

$$P_{SP}^{AlGaN}(x_k) = -0.090 x_k - 0.034(1-x_k) + 0.021 x_k (1-x_k) \quad [Cm^{-2}] \quad (9)$$

Here, the distortion $\epsilon_k$ of the layer at the $k^{th}$ in the n-type $Al_xGa_{1-x}N$ layer 23 is defined as the following Equation (10).

[Equation 10]

$$\varepsilon_k = \frac{a_0 - a_k}{a_k} \quad (10)$$

In the Equation (10), the meanings of the symbols are as follows:
$a_0$: lattice constant at interface between n-type $Al_xGa_{1-x}N$ layer 23 and n-type AlGaN layer 22
$a_k$: lattice constant of layer at $k^{th}$ from bottom in n-type $Al_xGa_{1-x}N$ layer 23 (Al composition ratio $x_k$)

In the present embodiment, the Al composition ratio decreases as it goes toward the upper part of the semiconductor device. Therefore, the lattice constant is greater at the upper part, which can be expressed as $\epsilon<0$. At this time, the piezoelectric polarization charge $P_{PZ}$ that is generated in AlGaN is expressed by the following Equation (11).

[Equation 11]

$$P_{PZ}^{AlGaN}(x_k) = -0.918\epsilon_k + 9.541\epsilon_k^2 - (0.89\epsilon_k + 3.915\epsilon_k^2) x_k \quad [Cm^{-2}] \quad (11)$$

The polarization charge $P_{POL}$ of the AlGaN layer at the $k^{th}$ from the bottom in the n-type $Al_xGa_{1-x}N$ layer 23 is expressed by the following Equation (12).

[Equation 12]

$$P_{POL}^{AlGaN}(x_k) = P_{SP}^{AlGaN}(x_k) + P_{PZ}^{AlGaN}(x_k) \quad (12)$$

There is the difference in the polarization charge between the layer at the $k-1^{th}$ from the bottom and the layer at the $k^{th}$ from the bottom, and the negative charge $\Delta\sigma_k$ corresponding to the difference is present at the interface between the both layers. The negative charge $\Delta\sigma_k$ is expressed by the following Equation (13).

[Equation 13]

$$\Delta\sigma_k = P_{POL}^{AlGaN}(x_k) - P_{POL}^{AlGaN}(x_{k-1}) \quad (13)$$

When the volume density of the negative charge at the interface is defined as $N_{POL}$ and the thickness of the AlGaN layer at the $k^{th}$ from the bottom is defined as $t_k$, the following Equation (14) is given.

[Equation 14]

$$N_{POL} = \frac{\Delta\sigma_k}{t_k} \quad (14)$$

Figure 1B:
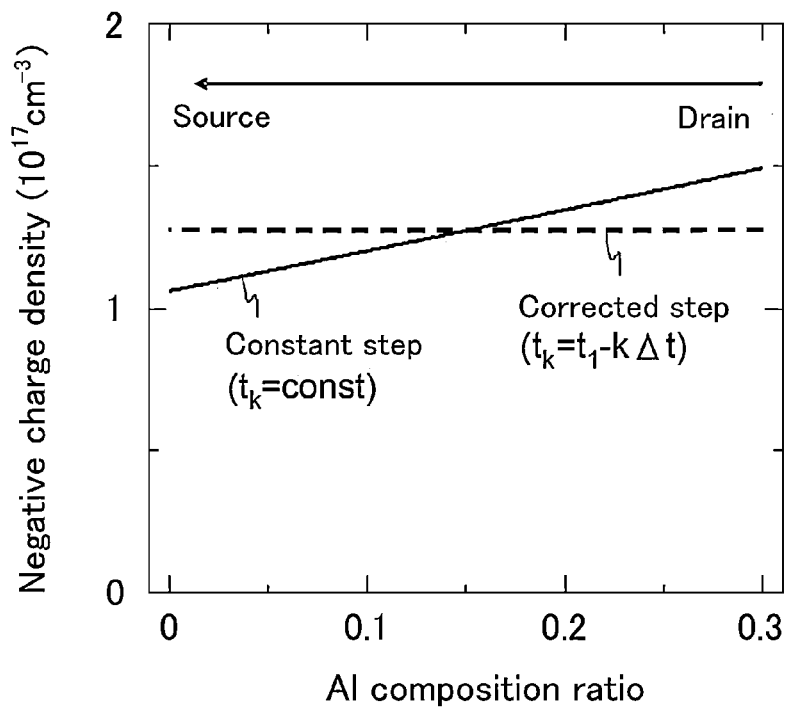
FIG. 1B is a graph showing the distribution of the polarization charge density in the graded composition AlGaN of the vertical transistor of Embodiment 1.

FIG. 1B is a graph showing the relationship between x and the charge density in the n-type $Al_xGa_{1-x}N$ layer that is calculated with the following conditions: $x_0=0.3$, $x_A=0$ (i.e., GaN), and K=100. In FIG. 1B, the horizontal axis shows the Al composition ratio and the vertical axis shows the negative charge density (q/cm$^3$). It is to be noted that, in FIG. 1B, the description of the "q (elementary charge)" of the unit of the negative charge density is omitted. Hereinafter, in the present invention, with respect to the charge density, the density or the concentration that is obtained by converting the multiples of the "q (elementary charge)" to the absolute value is described unless otherwise noted. For example, when the unit of the charge density is simply represented by "m$^{-3}$", it shall indicate the absolute value of the value that is obtained by dividing a charge that is present in 1 m$^{-3}$ by q (elementary charge). Further, in the present invention, with respect to the impurity concentration, the density or the concentration that is obtained by converting a maximum value of the charge that can be generated due to the impurity to the absolute value of the multiples of the "q (elementary charge)" is described unless otherwise noted. For example, when the unit of the impurity concentration is simply represented by "m$^{-3}$", it shall indicate the absolute value of the value that is obtained by dividing a maximum value of the charge that can be generated due to the impurity that is present in 1 m$^{-3}$ by q (elementary charge). A maximum value of the charge that can be generated due to the impurity is equal to the charge that is generated due to the impurity in the case where the activation rate (ionization rate) of the impurity is 100%. Further, the units of the charge density and the impurity concentration are cm$^{-3}$ unless otherwise noted. In FIG. 1B, calculation was made on the premise that the total thickness $t_{AlGaN}$ of the AlGaN layer (n-type $Al_xGa_{1-x}N$ layer) having composition that changes continuously (hereinafter this may be referred to as the "graded composition") was 1 μm. In FIG. 1B, the solid line indicated with "Constant step" shows the result of the case where $t_k$ was constant (10 nm). As can be seen from FIG. 1B, the negative charge density decreases approximately linearly from the drain side toward the source side. In this case, the change of about ±17% relative to the average negative charge density is generated. Also in such a charge distribution density, sufficient effects such as the cancellation of the positive charge due to the donor impurity and the improvement of the trade-off between the withstand voltage and the on-resistance can be obtained. Hereinafter, to make the negative charge density constant will be considered.

That is, as shown in FIG. 1B, since the surface density of the negative charge at the source side is high when $t_k$ is constant (10 nm), the volume density can be made constant by thinning $t_k$ in accordance with the decrease in the surface density. In other words, when the thickness of the 1$^{st}$ layer is defined as $t_1$, the following Equation (15) can be given.

[Equation 15]

$$t_k = t_1 - (k-1)\Delta t \qquad (15)$$

In this manner, on the basis of the premise that the second n-type semiconductor layer includes plural layers, if the thickness of the layer at the side where the Al composition ratio is high (the drain electrode side) is designed large and the thickness of the layer at the side where the Al composition ratio is low (the source electrode side) is designed small, the configuration in which the decreasing gradient of the Al composition ratio of the second n-type semiconductor layer is a steep gradient from the drain electrode side toward the source electrode side can be achieved. This makes it possible to make the negative charge density of the second n-type semiconductor layer uniform from the drain electrode side to the source electrode side as shown by the dashed line that is indicated with "Corrected step" in FIG. 1B, for example. This can be applied not only to the case where the thicknesses of the plural layers are sufficiently small and the composition change of the second n-type semiconductor layer can be regarded as continuous but also to the case where the thicknesses of the plural layers are large and the composition change of the second n-type semiconductor layer is stepwise.

Here, when the average of the negative charge density (m$^{-3}$) is defined as $N_{POL}^{AVG}$ and the difference is defined as $\Delta N_{POL}$, the following Equation (16) is given.

[Equation 16]

$$\Delta t = \frac{t_{AlGaN}}{K} \frac{\Delta N_{POL}}{N_{POL}^{AVG}} \qquad (16)$$

Figure 1C:
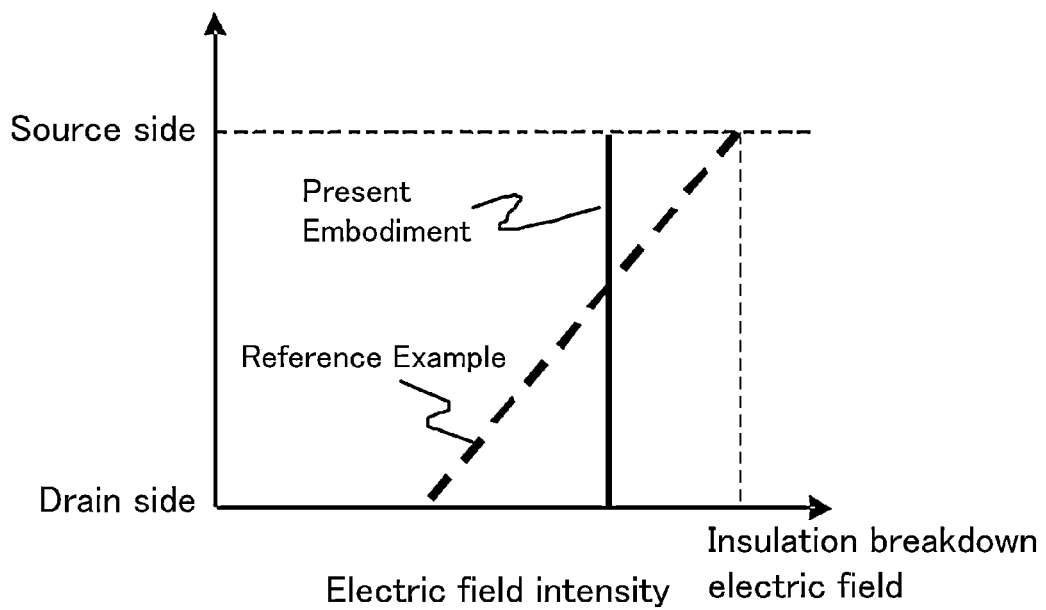
FIG. 1C is a graph schematically showing the electric field distribution in the vertical transistor of Embodiment 1 and the vertical transistor of Reference Example.
Figure 8:
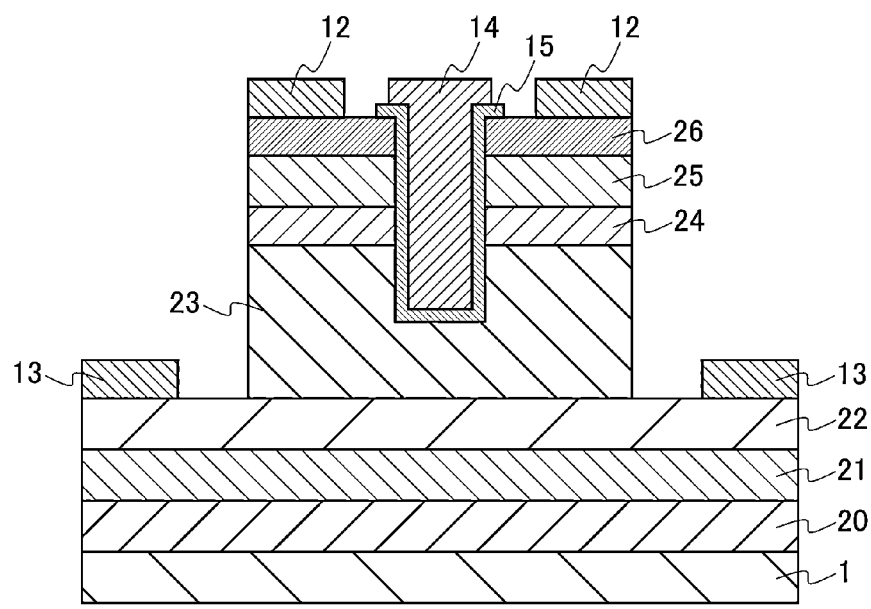
FIG. 8 is a cross sectional view showing the structure of the vertical transistor of Reference Example.

When the graded composition AlGaN layer that has such a negative charge density distribution is doped with donor impurity of $N_D = N_{POL}$, the electric field at the time of application of a reverse bias is at a constant value as in the case of an intrinsic semiconductor. The graph of FIG. 1C schematically shows this relationship. In FIG. 1C, the horizontal axis shows the electric field intensity and the vertical axis shows a position in the n-type $Al_xGa_{1-x}N$ layer 23 of FIG. 1A or the n-type AlGaN layer 23 of FIG. 8 from the drain electrode side toward the source electrode side in the direction perpendicular to the plane of the substrate. In FIG. 1C, "Present Embodiment" indicates the n-type $Al_xGa_{1-x}N$ layer 23 of FIG. 1 and "Reference Example" indicates the n-type AlGaN layer 23 of FIG. 8 having no composition gradient (change). As shown in FIG. 1C, in the vertical transistor of FIG. 8 having the n-type AlGaN layer 23 that has no composition gradient (change), the electric field intensity is the linear function and the electric field intensity shows its maximum value directly below the interface at the source side of the n-type AlGaN layer 23. The thickness of the n-type AlGaN layer 23 is designed so that a maximum value of the electric field intensity does not exceed the insulation breakdown electric field. On the other hand, when the vertical transistor of FIG. 1A (the present embodiment) is activated with the same semiconductor film thickness and the same reverse bias, the electric field intensity becomes uniform as shown in FIG. 1C, and its maximum value is decreased. In other words, with respect to the vertical transistor of FIG. 1A that satisfies the Equation (16), the reverse bias can further be applied, which means that the withstand voltage is increased. Hereinafter, this effect will be described in detail.

Since the electric field intensity is uniform in the vertical transistor of FIG. 1A that satisfies the Equation (16), the thickness $d_B$ (m) of the semiconductor layer required for achieving the withstand voltage $V_B$ is expressed by the following Equation (17).

[Equation 17]

$$d_B = \frac{V_B}{E_{crit}} \qquad (17)$$

The surface density of the polarization charge that can be generated in the vertical transistor of the present embodiment is expressed by the following Equation (18) based on the Equation (13). In other words, the surface density of the polarization charge is equal to the surface density in the case where the AlGaN layer having an Al composition ratio $x_A$ is formed at the upper side of the AlGaN buffer layer having an Al composition ratio $x_0$.

[Equation 18]

$$\sum_{k=1}^{K} \Delta \sigma_k = \sum_{k=1}^{K} (P_{POL}^{AlGaN}(x_k) - P_{POL}^{AlGaN}(x_{k-1})) \qquad (18)$$
$$= P_{POL}^{AlGaN}(x_K) - P_{POL}^{AlGaN}(x_0)$$
$$= P_{POL}^{AlGaN}(x_A)$$

On the basis of the Equations (17) and (18), the volume density $N_{POL}^{MAX}$ (C·m$^{-3}$) of the polarization charge that can be generated in the case where the withstand voltage of the vertical transistor of FIG. 1A that satisfies the Equation (16) is $V_B$ is expressed by the following Equation (19).

[Equation 19]

$$N_{POL}^{MAX} = \frac{P_{POL}^{AlGaN}(x_A)}{d_B} \qquad (19)$$

Since doping of the donor impurity having the same concentration as this value $N_{POL}^{MAX}$ can be performed in the present embodiment, on the basis of the Equation (6), the on-resistance $R_{on}$ (Ω·m$^2$) is expressed by the following Equation (20).

[Equation 20]

$$R_{on} = \frac{d_B}{qN_{POL}^{MAX}\mu} \quad (20)$$

The following Equation (21) is derived from the Equations (17), (19), and (20).

[Equation 21]

$$R_{on} = \frac{V_B^2}{q\mu P_{POL}^{AlGaN}(x_A)E_{crit}^2} \quad (21)$$

Figure 1D:
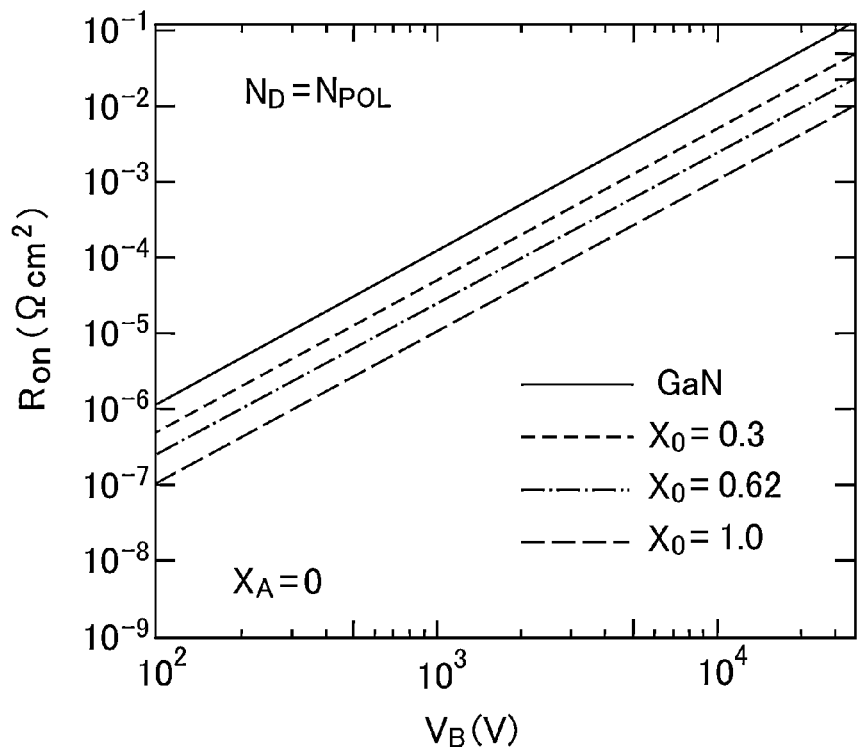
FIG. 1D is a graph showing the relationship between the onresistance and the withstand voltage in the vertical transistor of Embodiment 1 and the vertical transistor of Reference Example.

FIG. 1D is a graph plotting the relationship between the on-resistance $R_{on}$ and the withstand voltage $V_B$ on the basis of the Equations (8) and (21). In FIG. 1D, the vertical axis shows the on-resistance $R_{on}$ and the horizontal axis shows the withstand voltage $V_B$. The solid line shows the plot in the case where the composition ratio is constant at x=0 (i.e., the GaN layer). Three dashed lines show plots of the $Al_xGa_{1-x}N$ layer in the cases where x is continuously decreased from the values of $x_0$ shown in FIG. 1D to $x_A$=0. As shown in FIG. 1D, compared with the GaN layer indicated by the solid line, the $Al_xGa_{1-x}N$ layer 23 in which composition is changed from $x_0$=0.3 to $x_A$=0 can decrease the on-resistance to a third at the same withstand voltage. The on-resistance at the same withstand voltage can be decreased to 15% of the GaN layer by further increasing a polarization charge with $x_0$=0.62 and the on-resistance can be decreased to 8% of the GaN layer by generating a maximum polarization charge in this system with $x_0$=1.0. This tells that the vertical transistor of the present embodiment can greatly decrease the on-resistance as compared to a conventional vertical transistor at the same withstand voltage.

As described above, according to the present embodiment, by designing the n-type semiconductor layer as AlGaN having graded composition, the charge due to polarization can be distributed and cancelled by the charge due to impurity. Thereby, the charge density at the time of reverse bias can be set lower than the carrier density at the time of forward bias, and the improvement of the trade-off between the on-resistance and the withstand voltage beyond the physical limit that has been described can be achieved. More specifically, by decreasing the Al composition ratio of AlGaN from the drain side toward the source side, the negative charge can be distributed in the semiconductor layer formed of the AlGaN. This negative charge has the function of cancelling the positive charge due to donor impurity when the transistor is in the off-state. Therefore, the vertical transistor of the present embodiment can achieve a withstand voltage higher than a conventional vertical transistor if they have the semiconductor layers of the same thickness. On the other hand, since this negative charge does not affect the carrier concentration when the transistor is in the on-state, the on-resistance does not change. That is, according to the present embodiment, the trade-off between the on-resistance and the withstand voltage can be improved beyond the physical limit The method of producing the vertical transistor of FIG. 1A is not particularly limited and is, for example, as follows. First, a semiconductor is grown at the upper side of a sapphire substrate 1, for example, by the molecular beam epitaxy (MBE) growth method. The semiconductor layer formed in this manner has an undoped AlN buffer layer 20 (thickness: 20 nm), an undoped AlGaN buffer layer 21 (thickness: 2 μm), a high concentration n-type AlGaN layer 22 (thickness: 500 nm, doping concentration: $3\times10^{18}$ cm$^{-3}$, and Al composition ratio: 0.3), a graded composition n-type AlGaN layer 23 (thickness: 1.8 μm, doping concentration: $7.1\times10^{16}$ cm$^{-3}$, and Al composition ratio: 0.3→0), a p-type GaN layer 24 (thickness: 0.2 μm and doping concentration: $1\times10^{19}$ cm$^{-3}$), an n-type GaN layer 25 (thickness: 0.5 μm and doping concentration: $1\times10^{17}$ cm$^{-3}$), and a high concentration n-type GaN layer 26 (thickness: 0.2 μm and doping concentration: $1\times10^{18}$ cm$^{-3}$) from the substrate side in this order. Next, parts of the epitaxial structure are removed by etching until the high concentration n-type AlGaN layer 22 is exposed, drain electrodes 13 are formed by vapor deposition of metal such as Ti/Al, for example, at the upper side of the high concentration n-type AlGaN layer 22, and the drain electrodes 13 are brought into ohmic-contact with the high concentration n-type AlGaN layer 22 by annealing at 650° C. Then, source electrodes 12 are formed by vapor deposition of metal such as Ni/Au, for example, at the upper side of the high concentration n-type GaN layer 26. Thereafter, parts of the semiconductor layers between the source electrodes 12 are removed by etching until the upper layer of the graded composition n-type AlGaN layer 23 (thickness: 1.8 μm, doping concentration: $7.1\times10^{16}$ cm$^{-3}$, and Al composition ratio: 0.3→0) is exposed, and the gate insulation film 15 and the gate electrode 14 are formed sequentially. In this manner, the vertical transistor shown in FIG. 1A is produced. The vertical transistor produced in this manner can decrease the on-state resistance, for example, to $1.6\times10^{-5}$ Ω·m$^2$, which is a third of a conventional art, with respect to the withstand voltage at 600 V.

Figure 1E:
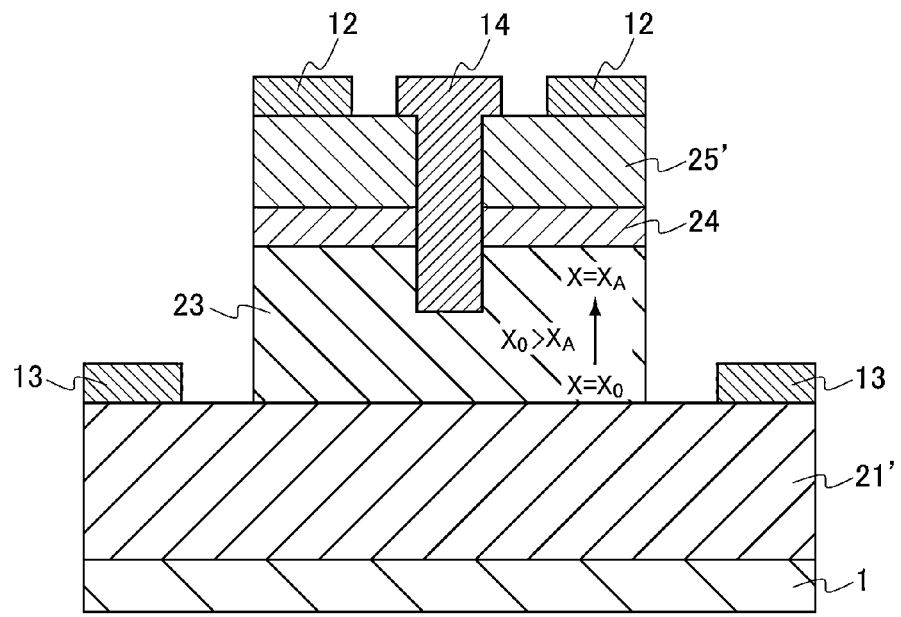
FIG. 1E is a cross sectional view showing another example of the structure of the vertical transistor of Embodiment 1.

The present invention is not limited to the aforementioned description. For example, the semiconductor device of the present invention is not limited to the field effect transistor and can be any semiconductor device as long as it satisfies the requirements of the present invention. Further, for example, the first n-type semiconductor layer, the second n-type semiconductor layer, the p-type semiconductor layer, and the third n-type semiconductor layer are each preferably a nitride semiconductor layer. As described above, each of these layers is more preferably a III-nitride semiconductor layer. However, the present invention is not limited thereto and any semiconductor layer can be employed. Further, the first n-type semiconductor layer, the second n-type semiconductor layer, the p-type semiconductor layer, and the third n-type semiconductor layer may be laminated at the upper side of the substrate via other layer(s) such as a buffer layer as shown in FIG. 1A or the first n-type semiconductor layer, the second n-type semiconductor layer, the p-type semiconductor layer, and the third n-type semiconductor layer may be laminated directly on the substrate as shown in FIG. 1E. The first n-type semiconductor layer and the third n-type semiconductor layer are each preferably formed of plural layers as shown in FIG. 1A from the viewpoint of smooth contact with other layers, electrical properties of semiconductor devices, and the like. However, the first n-type semiconductor layer and the third n-type semiconductor layer may each have a monolayer structure. For example, in place of the AlGaN buffer layer 21 and the high concentration n-type AlGaN layer 22 shown in FIG. 1A, a first n-type semiconductor layer 21', which is a monolayer, may be arranged as shown in FIG. 1E. Further, for example, in place of the n-type GaN layer 25 and the high concentration n-type GaN layer 26 shown in FIG. 1A, a third n-type semiconductor layer 25', which is a monolayer, may be arranged as shown in FIG. 1E. For example, as shown in FIG. 1A, the gate electrode 14 preferably has a so-called MIS structure in which an electrode is in contact with semiconductor layers via a gate insulation film. However, for example, as shown in FIG. 1E, the gate electrode 14 may directly be in Schottky-contact with the second n-type semiconductor layer, the p-type semiconductor layer, and the third n-type semiconductor layer without involving a gate insulation film. In the present invention, "contact" may represent the state in which components are directly in contact with each other or the state in which components are in contact with each other via other component(s). For example, the state in which the gate electrode is in contact with the second n-type semiconductor layer, the p-type semiconductor layer, and the third n-type semiconductor layer may be the state in which the gate electrode is directly in contact with the second n-type semiconductor layer, the p-type semiconductor layer, and the third n-type semiconductor layer. Alternatively, the state in which the gate electrode is in contact with the second n-type semiconductor layer, the p-type semiconductor layer, and the third n-type semiconductor layer may be the state in which the gate electrode is in contact with the second n-type semiconductor layer, the p-type semiconductor layer, and the third n-type semiconductor layer via a gate insulation film. Further, preferably, the second n-type semiconductor layer has composition represented by $Al_xGa_{1-x}N$ ($0 \leq x < 1$) as shown in FIG. 1A, and the relationship between the Al composition ratio at the interface at the first n-type semiconductor layer side $x_0$ ($x_0 > 0$) and the Al composition ratio at the interface at the p-type semiconductor layer side $x_A$ ($x_A \geq 0$) satisfies the following equation: $x_0 > x_A$. However, the present invention is not limited thereto. For example, the first n-type semiconductor may be GaN and the second n-type semiconductor layer may be a III-nitride semiconductor other than AlGaN such as InGaN, InAlGaN, or the like. More specifically, for example, the second n-type semiconductor layer may have composition represented by $In_yGa_{1-y}N$ ($0 \leq y < 1$), and the composition ratio y may increase from the drain electrode side toward the source electrode side. In this case, the relationship between the composition ratio of InGaN at the interface at the first n-type semiconductor layer side $y_0$ ($y_0 \geq 0$) and the composition ratio of InGaN at the interface at the p-type semiconductor layer side $y_A$ ($y_A > 0$) satisfies the following equation: $y_A > y_0$. Also, for example, the second n-type semiconductor layer may have composition represented by $In_xAl_yGa_{1-x-y}N$ ($0 \leq x < 1$, $0 \leq y < 1$) and may satisfy at least one of the condition in which the composition ratio x increases from the drain electrode side toward the source electrode side and the condition in which the composition ratio y decreases from the drain electrode side toward the source electrode side. In the case where the composition ratio x increases from the drain electrode side toward the source electrode side, the relationship between the composition ratio at the interface at the first n-type semiconductor layer side $x_0$ ($x_0 \geq 0$) and the composition ratio at the interface at the p-type semiconductor layer side $x_A$ ($x_A > 0$) satisfies the following equation: $x_A > x_0$. In the case where the composition ratio y decreases from the drain electrode side toward the source electrode side, the relationship between the composition ratio at the interface at the first n-type semiconductor layer side $y_0$ ($y_0 \geq 0$) and the composition ratio at the interface at the p-type semiconductor layer side $y_A$ ($y_A > 0$) satisfies the following equation: $y_0 > y_A$. Further, the positions of the source electrodes and the drain electrodes are not limited to those shown in FIG. 1A. Furthermore, sapphire is employed as the material of the substrate in the present embodiment. However, the present invention is not limited thereto and any material such as SiC, Si, GaN, or the like can be employed. Moreover, the substrate is not limited to a single material and a substrate composed of plural materials such as SOI may be employed. The same applies to the following embodiments.

Embodiment 2

Next, Embodiment 2 of the present invention will be described.

Figure 2A:
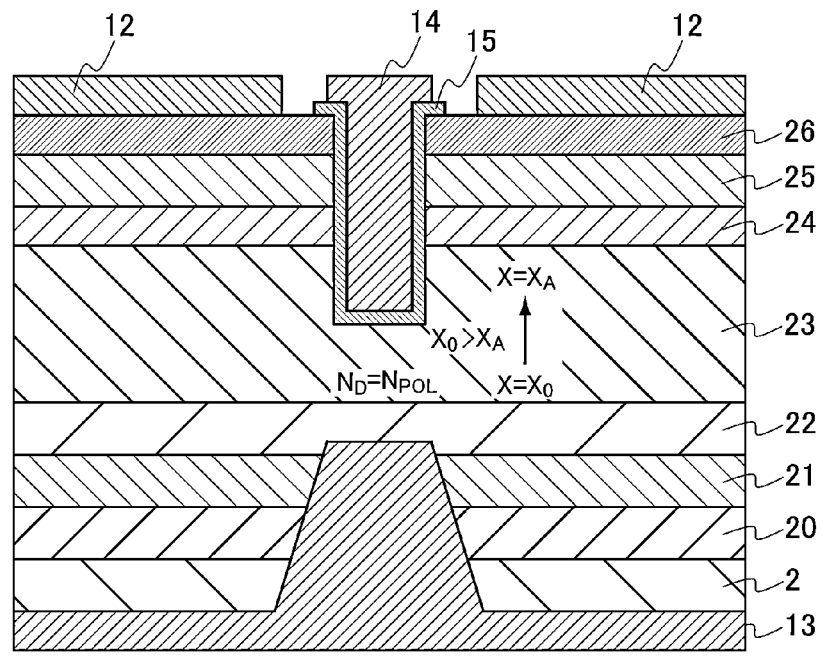
FIG. 2A is a cross sectional view showing an example of the structure of the vertical transistor of Embodiment 2.

FIG. 2A is a cross sectional view showing the structure of the semiconductor device of the present embodiment. This vertical transistor is formed at the upper side of a substrate 2 such as SiC. On the upper surface of the substrate 2, a buffer layer 20, an AlGaN buffer layer 21, and a high concentration n-type AlGaN layer 22 grown on Ga-face are laminated in this order. Further, on the upper surface of the high concentration n-type AlGaN layer 22, an n-type $Al_xGa_{1-x}N$ layer 23, a p-type GaN layer 24, an n-type GaN layer 25, and a high concentration n-type GaN layer 26 are laminated in this order. At the upper side of the high concentration n-type GaN layer 26, source electrodes 12 that are in ohmic-contact with the high concentration n-type GaN layer 26 are arranged. On the lower surface of the SiC substrate 2, a drain electrode 13 that is in contact with the high concentration n-type AlGaN layer 22 via a via hole (an opening portion to be filled that extends through the substrate 2, the buffer layer 20, and the AlGaN buffer layer 21 to the lower part of the high concentration n-type AlGaN layer 22 grown on Ga-face) is arranged. Arrangement of the gate electrode is the same as that shown in FIG. 1A. The Al composition ratio x of the $Al_xGa_{1-x}N$ layer 23 decreases from the drain side toward the source side. Here, the AlGaN buffer layer 21 and the high concentration n-type AlGaN layer 22 grown on Ga-face each correspond to the "first n-type semiconductor layer". The $Al_xGa_{1-x}N$ layer 23 corresponds to the "second semiconductor layer". The p-type GaN layer 24 corresponds to the "p-type semiconductor layer". The n-type GaN layer 25 and the high concentration n-type GaN layer 26 each correspond to the "third n-type semiconductor layer".

The vertical transistor of FIG. 2A can be produced, for example, as follows. The aforementioned semiconductor layers are grown at the upper side of the SiC substrate 2, for example, by the molecular beam epitaxy (MBE) growth method. The semiconductor layer formed in this manner has, for example, an undoped AlN buffer layer 20 (thickness: 20 nm), an undoped AlGaN buffer layer 21 (thickness: 2 µm), a high concentration n-type AlGaN layer 22 (thickness: 500 nm, doping concentration: $3 \times 10^{18}$ cm$^{-3}$, and Al composition ratio: 0.3), a graded composition n-type AlGaN layer 23 (thickness: 1.8 µm, doping concentration: $7.1 \times 10^{16}$ cm$^{-3}$, and Al composition ratio: 0.3→0), a p-type GaN layer 24 (thickness: 0.2 µm and doping concentration: $1 \times 10^{19}$ cm$^{-3}$), an n-type GaN layer 25 (thickness: 0.5 µm and doping concentration: $1 \times 10^{17}$ cm$^{-3}$), and a high concentration n-type GaN layer 26 (thickness: 0.2 µm and doping concentration: $1 \times 10^{18}$ cm$^{-3}$) from the substrate side in this order.

Then, source electrodes 12 are formed by vapor deposition of metal such as Ni/Au, for example, at the upper side of the high concentration n-type GaN layer 26. Thereafter, parts of the semiconductor layers between the source electrodes 12 are removed by etching until the upper layer of the graded composition n-type AlGaN layer 23 (thickness: 1.8 µm, doping concentration: $7.1 \times 10^{16}$ cm$^{-3}$, and Al composition ratio: 0.3→0) is exposed, and a gate insulation film 15 and a gate electrode 14 are formed sequentially. Further, a part of the SiC substrate 2, a part of the undoped AlN buffer layer 20, and a part of the undoped AlGaN buffer layer 21 are removed by etching until the high concentration n-type AlGaN layer 22 is exposed to form a via hole (opening portion to be filled), and a drain electrode 13 is formed by vapor deposition of metal such as Ti/Al, for example, so that it is in contact with the high concentration n-type AlGaN layer 22. In this manner, the vertical transistor shown in FIG. 2A is produced. Since the vertical transistor produced in this manner has a semiconductor layer structure similar to that of Embodiment 1, for example, the on-resistance can be decreased, for example, to $1.6 \times 10^{-5}$ Ω·m², which is a third of a conventional art, with respect to the withstand voltage at 600 V. Further, since the drain electrode is formed on the back surface (lower surface), a substantial chip area can further be reduced.

Figure 2B:
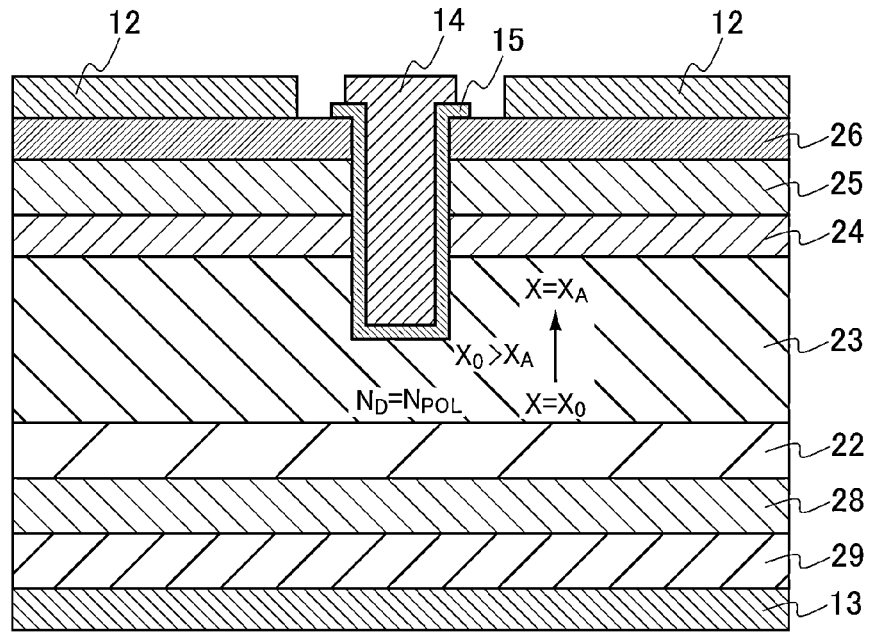
FIG. 2B is a cross sectional view showing another example of the structure of the vertical transistor of Embodiment 2.
Figure 2C:
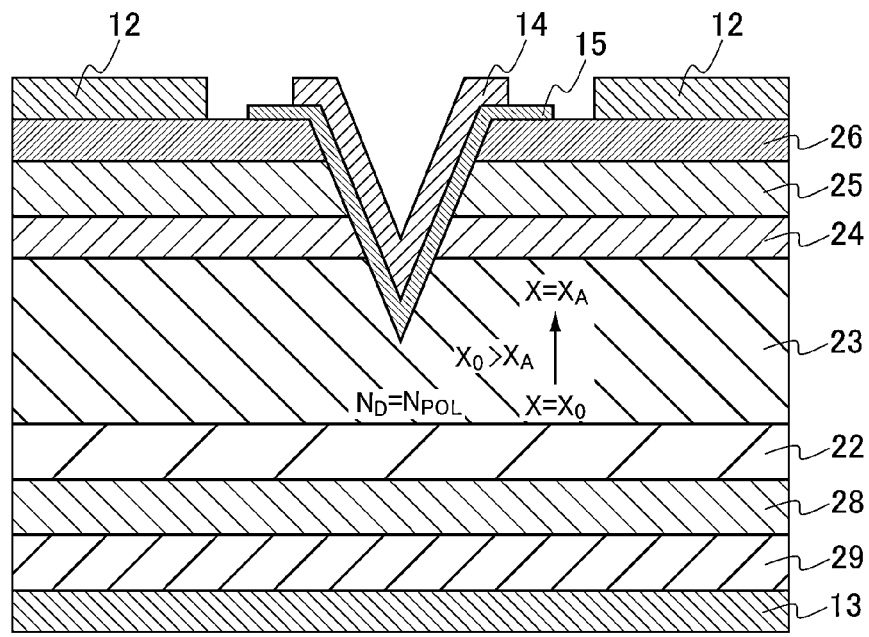
FIG. 2C is a cross sectional view showing yet another example of the structure of the vertical transistor of Embodiment 2.

For example, in the case where a high concentration n-type conductive substrate is used as the substrate, as shown in FIG. 2B or FIG. 2C, without forming a via hole (opening portion to be filled) in the substrate 2, the undoped AlN buffer layer 20, and the undoped AlGaN buffer layer 21, a drain electrode 13 formed on the lower surface of the n-type conductive substrate 29 can be electrically connected to the high concentration n-type GaN layer 28 and the high concentration n-type AlGaN layer 22 (first n-type semiconductor layer) via the n-type conductive substrate 29. The vertical transistors shown in FIG. 2B and FIG. 2C each have a structure similar to that of the vertical transistor shown in FIG. 2A except that each of the vertical transistors shown in FIG. 2B and FIG. 2C uses the n-type conductive substrate 29 in place of the SiC substrate 2, is not provided with the buffer layer 20, is provided with the high concentration n-type GaN layer 28 in place of the AlGaN buffer layer 21, and, as described above, has no via hole (opening portion to be filled) formed in the SiC substrate 2, the undoped AlN buffer layer 20, and the undoped AlGaN buffer layer 21. The shape of the gate electrode may be a rectangle (FIG. 2B) as in the case of the electrodes shown in FIG. 1A and FIG. 2A, a V-shape (FIG. 2C), a trapezoid having a short base, or the like.

Further, in the case where the drain electrode is formed from the lower surface side of the first n-type semiconductor layer as shown in FIGS. 2A, 2B, and 2C, for example, the first n-type semiconductor layer may have composition that changes continuously or in a stepwise manner from the drain electrode side toward the source electrode side in the direction perpendicular to the plane of the substrate. In this case, for example, the first n-type semiconductor layer and the second n-type semiconductor layer may have no boundary therebetween and they may form one layer having composition that changes continuously or in a stepwise manner from the drain electrode side of the first n-type semiconductor layer to the source electrode side of the second n-type semiconductor layer.

Further, the positions of the source electrodes and the drain electrode are not limited to those shown in FIGS. 2A, 2B, and 2C. Furthermore, SiC is employed as the material of the substrate in the present embodiment. However, the present invention is not limited thereto and any material such as sapphire, Si, GaN, or the like can be employed. Moreover, the substrate is not limited to a single material and a substrate composed of plural materials such as SOI may be employed.

Embodiment 3

Next, Embodiment 3 of the present invention will be described.

Figure 3:
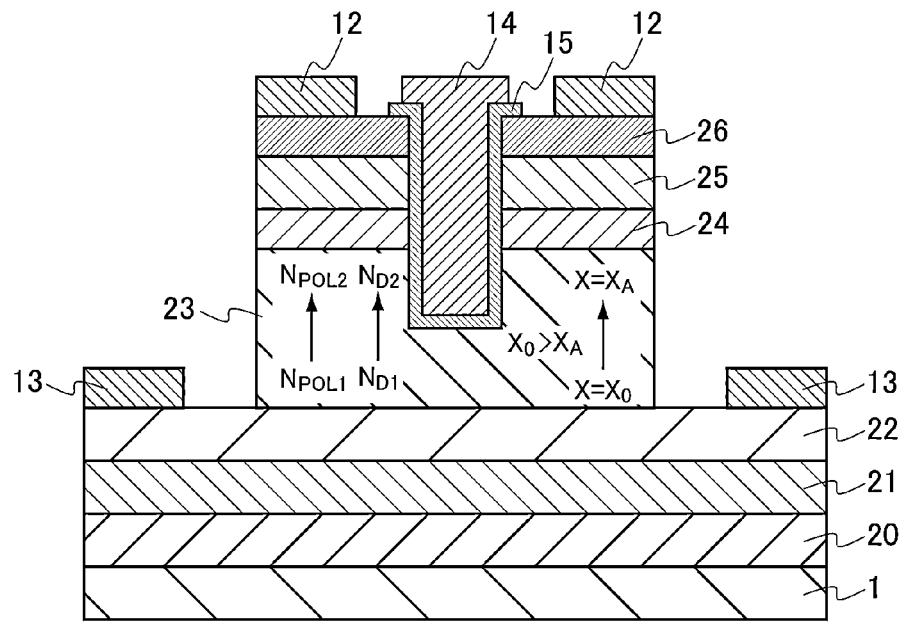
FIG. 3 is a cross sectional view showing the structure of the vertical transistor of Embodiment 3.

FIG. 3 is a cross sectional view showing the structure of the vertical transistor of the present embodiment. This vertical transistor has a structure similar to that of the vertical transistor of Embodiment 1 except that the way of change of the composition of the n-type Al$_x$Ga$_{1-x}$N layer 23 is different. In FIG. 3, although the Al composition ratio x of the Al$_x$Ga$_{1-x}$N layer 23 decreases from the drain side toward the source side, the vertical transistor of the present embodiment is different from that of Embodiment 1 in the following points.

In the n-type Al$_x$Ga$_{1-x}$N layer 23 of Embodiment 1, the volume density of a negative charge due to polarization is kept constant by changing the amount of increase of the thickness with respect to the Al composition ratio. In contrast, in the present embodiment, the change of the thickness is kept constant with respect to the change of the Al composition ratio. In this case, the volume density of a negative charge due to polarization is high at the drain side ($N_{POL1}$) and is low at the source side ($N_{POL2}$) as shown in FIG. 3. Therefore, by giving the same distribution as the volume density of the negative charge to the donor impurity concentration, i.e., by setting the donor impurity concentration at the drain electrode side $N_{D1}$ high and setting the donor impurity concentration at the source electrode side $N_{D2}$ low, both of the volume density of the negative charge and the donor impurity concentration are cancelled. Since the present embodiment can also achieve the state in which the charge is cancelled at the time of reverse bias, the same performance as Embodiment 1 can be obtained.

The method of producing the vertical transistor of FIG. 3 is not particularly limited and is, for example, as follows. First, a semiconductor is grown at the upper side of the sapphire substrate 1, for example, by the molecular beam epitaxy (MBE) growth method. The semiconductor layer formed in this manner has, for example, an undoped AlN buffer layer 20 (thickness: 20 nm), an undoped AlGaN buffer layer 21 (thickness: 2 μm), a high concentration n-type AlGaN layer 22 (thickness: 500 nm, doping concentration: $3 \times 10^{18}$ cm$^{-3}$, and Al composition ratio: 0.3), a graded composition n-type AlGaN layer 23 (thickness: 1.8 μm, doping concentration $7.1 \times 10^{16}$ cm$^{-3}$, and Al composition ratio 0.3→0), a p-type GaN layer 24 (thickness: 0.2 μm and doping concentration: $1 \times 10^{19}$ cm$^{-3}$), an n-type GaN layer 25 (thickness: 0.5 μm and doping concentration: $1 \times 10^{17}$ cm$^{-3}$), and a high concentration n-type GaN layer 26 (thickness: 0.2 μm and doping concentration: $1 \times 10^{18}$ cm$^{-3}$) from the substrate side in this order.

Next, parts of the epitaxial structure are removed by etching until the n-type AlGaN layer 22 is exposed, drain electrodes 13 are formed by vapor deposition of metal such as Ti/Al, for example, at the upper side of the high concentration n-type AlGaN layer 22, and the drain electrodes 13 are brought into ohmic-contact with the high concentration n-type AlGaN layer 22 by annealing at 650° C. The gate electrode is produced in the same manner as in Embodiments 1 and 2. In this manner, the vertical transistor shown in FIG. 3 is produced. The vertical transistor produced in this manner can decrease the on-state resistance, for example, to $1.6 \times 10^{-5}$ Ω·cm², which is a third of a conventional art, with respect to the withstand voltage at 600 V.

In FIG. 3, the drain electrodes are arranged on the upper surface of the first n-type semiconductor layer in the same manner as in Embodiment 1. However, the drain electrode may be arranged at the lower surface side of the first n-type semiconductor layer in the same manner as in Embodiment 2. Further, the positions of the source electrodes and the drain electrodes are not limited to those shown in FIG. 3. Furthermore, the material of the substrate is not limited to SiC and sapphire and may be Si, GaN, or the like. Moreover, the substrate is not limited to a single material and a substrate composed of plural materials such as SOI may be employed.

Embodiment 4

Next, Embodiment 4 of the present invention will be described.

Figure 4A:
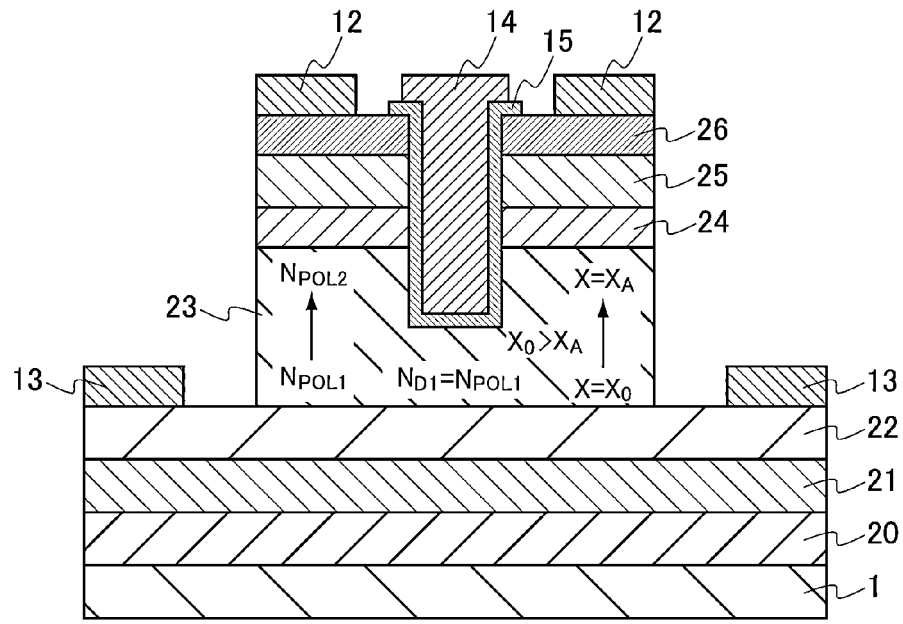
FIG. 4A is a cross sectional view showing the structure of the vertical transistor of Embodiment 4.

FIG. 4A is a cross sectional view showing the structure of the vertical transistor of the present embodiment. This vertical transistor has a structure similar to that of the vertical transistors of Embodiments 1 and 3 except that the way of change of the composition of the n-type $Al_xGa_{1-x}N$ layer 23 is different. In FIG. 4A, although the Al composition ratio x of the $Al_xGa_{1-x}N$ layer 23 decreases from the drain side toward the source side, the vertical transistor of the present embodiment is different from the vertical transistors of Embodiments 1 and 3 in the following points.

Figure 4B:
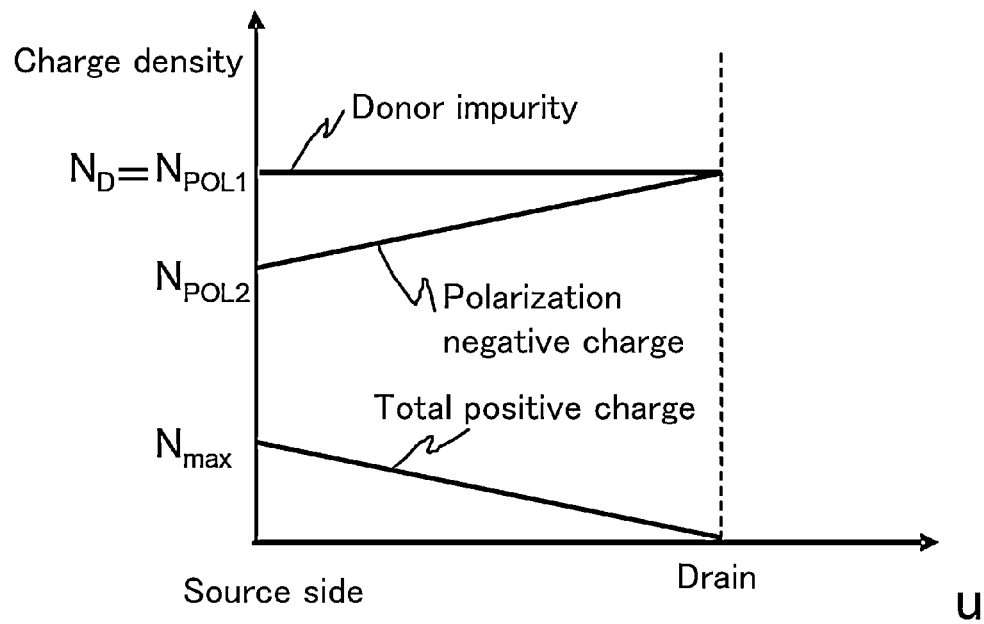
FIG. 4B is a graph schematically showing the charge distribution in Embodiment 4.

In Embodiment 1, the volume density of a negative charge due to polarization is kept constant by changing the amount of increase of the thickness with respect to the Al composition ratio. In contrast, in the present embodiment, the change of the thickness is kept constant with respect to the change of the Al composition ratio. In this case, the volume density of a negative charge due to polarization is high at the drain side and is low at the source side. In Embodiment 3, the same distribution as this distribution is given to the donor impurity concentration. In contrast, in the present embodiment, the donor impurity concentration has a distribution that is uniform over the entire structure. In FIG. 4B, shown is the distribution of the volume density of the negative charge (negative charge density) of the n-type $Al_xGa_{1-x}N$ layer 23 of the present embodiment. In FIG. 4B, the vertical axis shows the negative charge density and the positive charge (total positive charge) density and the horizontal axis shows a position from the source electrode side to the drain electrode side in the direction perpendicular to the plane of the substrate. As shown in FIG. 4B, when the negative charge density at the drain side is defined as $N_{POL1}$ and the negative charge density at the source side is defined as $N_{POL2}$, the following equations are satisfied: $N_D = N_{POL1}$ and $N_{POL1} > N_{POL2}$. The total positive charge shows the highest value $N_{max}$ at the source side and shows 0 at the drain side. When the change of the composition with respect to u is constant ($\beta$), the distribution of the polarization charge density is expressed by the following Equation (22).

[Equation 22]

$$\frac{\sigma(u)}{q} = N_{max} - \beta u \tag{22}$$

Since the charge at the depletion layer end is 0, the depletion layer width W (m) is expressed by the following Equation (23).

[Equation 23]

$$W = \frac{N_{max}}{\beta} \tag{23}$$

Further, since the electric field at the depletion layer end is 0, when the Equation (22) is integrated with respect to u, the following Equation (24) can be derived.

[Equation 24]

$$E = -\frac{q\beta}{2\varepsilon_s}u^2 + \frac{qN_{max}}{\varepsilon_s}u - \frac{qN_{max}^2}{2\varepsilon_s} \tag{24}$$

Since the electric field intensity shows a maximum value at u=0, the following Equation (25) is given.

[Equation 25]

$$E_{max} = \frac{qN_{max}^2}{2\varepsilon_s} \tag{25}$$

The following Equation (26) is given by integrating the Equation (24) with respect to u on the assumption that the following conditions are satisfied: V=0 at the depletion layer end and $V=V_B$ with u=0.

[Equation 26]

$$V_B = \frac{10\varepsilon_s E_{crit}^2}{3qN_{max}} \tag{26}$$

On the basis of the Equations (6), (23), and (25), the following Equation (27) is given.

[Equation 27]

$$R_{on} = \frac{2\varepsilon_s E_{crit}}{qN_{max}N_D\mu} \tag{27}$$

Figure 4C:
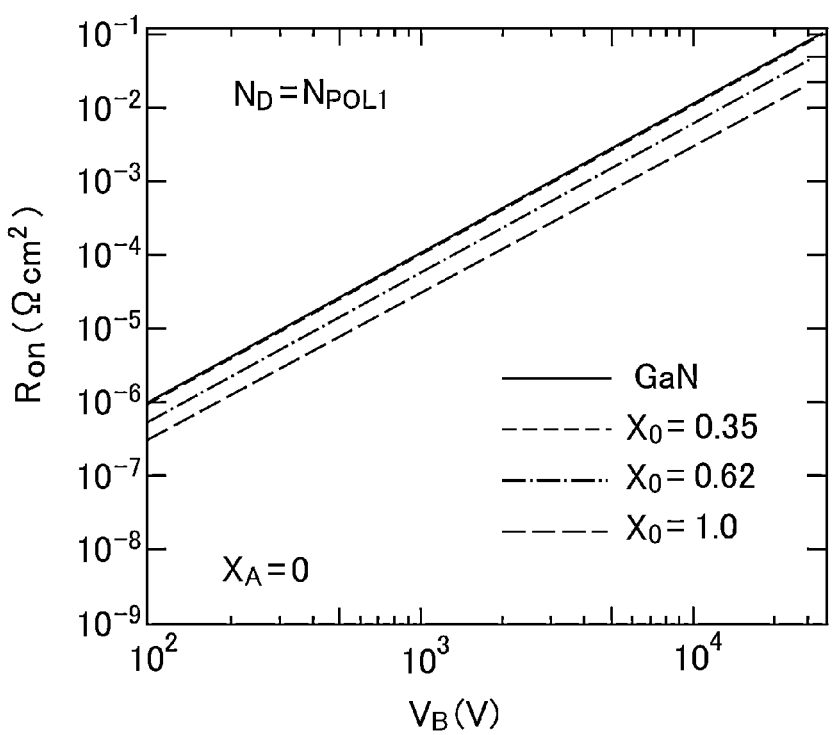
FIG. 4C is a graph showing the relationship between the onresistance and the withstand voltage in the vertical transistor of Embodiment 4 and the vertical transistor of Reference Example.

In the graph of FIG. 4C, the relationship between the on-resistance and the withstand voltage of the $Al_xGa_{1-x}N$ layer 23 is plotted on the basis of the Equations (26) and (27). In FIG. 4C, the vertical axis shows the on-resistance $R_{on}$ and the horizontal axis shows the withstand voltage $V_B$. The solid line shows the plot in the case where the composition ratio is constant at x=0 (i.e., the GaN layer). Three dashed lines show plots of the $Al_xGa_{1-x}N$ layer in the cases where x is continuously decreased from the values of $x_0$ shown in FIG. 4C to $x_A=0$. As shown in FIG. 4C, in the vertical transistor of the present embodiment in which the composition is changed from $x_0=0.35$ to $x_A=0$, compared with the GaN layer, the on-resistance at the same withstand voltage is slightly decreased. The on-resistance at the same withstand voltage can be decreased to a half of the GaN layer by further increasing a polarization charge with $x_0=0.62$ and can be decreased to a quarter of the GaN layer by generating a maximum polarization charge in this system with $x_0=1.0$. This tells that the vertical transistor of the present embodiment can greatly decrease the on-resistance as compared to a conventional vertical transistor at the same withstand voltage.

The method of producing the vertical transistor of FIG. 4A is not particularly limited and is, for example, as follows. First, a semiconductor is grown at the upper side of a sapphire substrate 1, for example, by the molecular beam epitaxy (MBE) growth method. The semiconductor layer formed in this manner has, for example, an undoped AlN buffer layer 20 (thickness: 20 nm), an undoped AlGaN buffer layer 21 (thickness: 2 μm), a high concentration n-type AlGaN layer 22 (thickness: 500 nm, doping concentration: $3\times10^{18}$ cm$^{-3}$, and Al composition ratio: 0.3), a graded composition n-type AlGaN layer 23 (thickness: 3.6 μm, doping concentration: $1.1\times10^{17}$ cm$^{-3}$, and Al composition ratio: 0.62→0), a p-type GaN layer 24 (thickness: 0.2 μm and doping concentration: $1\times10^{19}$ cm$^{-3}$), an n-type GaN layer 25 (thickness: 0.5 μm and doping concentration: $1\times10^{17}$ cm$^{-3}$), and a high concentration n-type GaN layer 26 (thickness: 0.2 μm and doping concentration: $1\times10^{18}$ cm$^{-3}$) from the substrate side in this order. Next, parts of the epitaxial structure are removed by etching until the high concentration n-type AlGaN layer 22 is exposed, drain electrodes 13 are formed by vapor deposition of metal such as Ti/Al, for example, at the upper side of the high concentration n-type AlGaN layer 22, and the drain electrodes 13 are brought into ohmic-contact with the high concentration n-type AlGaN layer 22 by annealing at 650° C. The gate electrode can be formed in the same manner as in Embodiments 1 and 3. In this manner, the vertical transistor shown in FIG. 4A is produced. The vertical transistor produced in this manner can decrease the on-state resistance, for example, to $2.1\times10^{-5}$ Ω·m$^2$, which is a half of a conventional art, with respect to the withstand voltage at 600 V.

In FIG. 4A, the drain electrodes are arranged on the upper surface of the first n-type semiconductor layer in the same manner as in Embodiment 1. However, the drain electrode may be arranged at the lower surface side of the first n-type semiconductor layer in the same manner as in Embodiment 2. Further, the positions of the source electrodes and the drain electrodes are not limited to those shown in FIG. 4A. Furthermore, the material of the substrate is not limited to SiC and sapphire and may be Si, GaN, or the like. Moreover, the substrate is not limited to a single material and a substrate composed of plural materials such as SOI may be employed.

Embodiment 5

Next, Embodiment 5 of the present invention will be described.

Figure 5A:
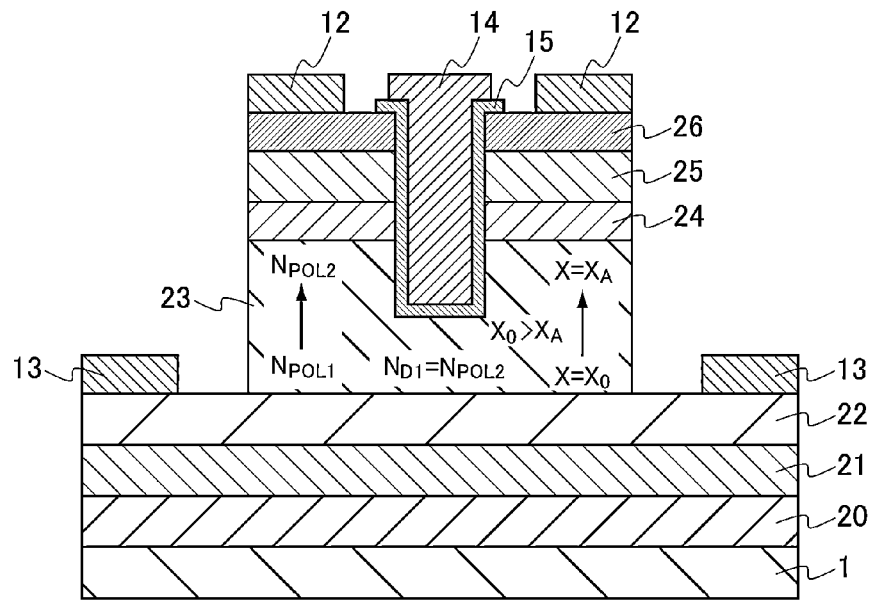
FIG. 5A is a cross sectional view showing the structure of the vertical transistor of Embodiment 5.

FIG. 5A is a cross sectional view showing the structure of the vertical transistor of the present embodiment. This vertical transistor has a structure similar to that of the vertical transistors of Embodiments 1, 3 and 4 except that the way of change of the composition of the n-type $Al_xGa_{1-x}N$ layer 23 is different. In FIG. 5A, although the Al composition ratio x of the $Al_xGa_{1-x}N$ layer 23 decreases from the drain side toward the source side, the vertical transistor of the present embodiment is different from the vertical transistors of the aforementioned embodiments in the following points.

Figure 5B:
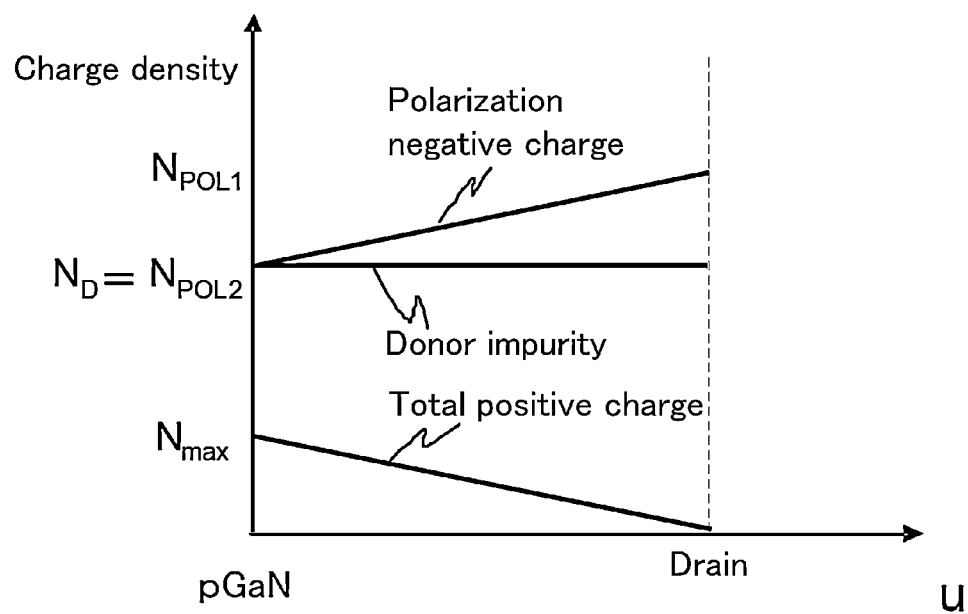
FIG. 5B is a graph schematically showing the charge distribution in Embodiment 5.

In Embodiment 4, the donor impurity concentration of the n-type $Al_xGa_{1-x}N$ layer 23 is set equal to that at the drain side. In contrast, in the present embodiment, the donor impurity concentration of the n-type $Al_xGa_{1-x}N$ layer 23 is set equal to that at the source side. In other words, the donor impurity concentration in Embodiment 4 is set equal to a maximum value of the polarization charge density that is generated due to the composition change of Al whereas the donor impurity concentration in the present embodiment is set equal to a minimum value of the polarization charge density. FIG. 5B shows this relationship. In FIG. 5B, the vertical axis shows the negative charge density and the positive charge (total positive charge) density of the n-type $Al_xGa_{1-x}N$ layer 23 and the horizontal axis shows a position from the source electrode side to the drain electrode side in the direction perpendicular to the plane of the substrate. As shown in FIG. 5B, when the negative charge density at the drain side is defined as $N_{POL1}$ and the negative charge density of the source side is defined as $N_{POL2}$, the following equations are satisfied: $N_D=N_{POL2}$ and $N_{POL1}>N_{POL2}$. The total positive charge shows the highest value $N_{max}$ ($N_{max}=0$) at the source (pGaN) side and shows minus at the drain side. Although the negative charge due to polarization remains, since the present embodiment is the same as Embodiment 4 except that the positive and the negative of the charge are inverted, the relationship between the on-resistance and the withstand voltage in the present embodiment is nearly the same as that in Embodiment 4. The present embodiment is different from Embodiment 4 in that the electric field shows its peak at the drain side and the doping concentration is equal to that at the source side and therefore is lower than Embodiment 4. Further, Embodiments 4 and 5 show examples in which the donor impurity concentration agrees with a maximum value or a minimum value of the polarization negative charge density. However, similar performances can be obtained with arbitrary composition between the maximum value and the minimum value.

The method of producing the vertical transistor of FIG. 5A is not particularly limited and is, for example, as follows. First, a semiconductor is grown at the upper side of a sapphire substrate 1, for example, by the molecular beam epitaxy (MBE) growth method. The semiconductor layer formed in this manner has, for example, an undoped AlN buffer layer 20 (thickness: 20 nm), an undoped AlGaN buffer layer 21 (thickness: 2 μm), a high concentration n-type AlGaN layer 22 (thickness: 500 nm, doping concentration: $3\times10^{18}$ cm$^{-3}$, and Al composition ratio: 0.3), a graded composition n-type AlGaN layer 23 (thickness: 3.6 μm, doping concentration: $9\times10^{16}$ cm$^{-3}$, and Al composition ratio: 0.62→0), a p-type GaN layer 24 (thickness: 0.2 μm and doping concentration: $1\times10^{19}$ cm$^{-3}$), an n-type GaN layer 25 (thickness: 0.5 μm and doping concentration: $1\times10^{17}$ cm$^{-3}$), and a high concentration n-type GaN layer 26 (thickness: 0.2 μm and doping concentration: $1\times10^{18}$ cm$^{-3}$) from the substrate side in this order. Next, parts of the epitaxial structure are removed by etching until the high concentration n-type AlGaN layer 22 is exposed, drain electrodes 13 are formed by vapor deposition of metal such as Ti/Al, for example, at the upper side of the high concentration n-type AlGaN layer 22, and the drain electrodes 13 are brought into ohmic-contact with the high concentration n-type AlGaN layer 22 by annealing at 650° C. Then, source electrodes 12 are formed by vapor deposition of metal such as Ni/Au, for example, at the upper side of the high concentration n-type GaN layer 26. The gate electrode can be formed in the same manner as in Embodiments 1, 3, and 4. In this manner, the vertical transistor shown in FIG. 5A is produced. The vertical transistor produced in this manner can decrease the on-state resistance, for example, to $2.2\times10^{-5}$ Ω·m$^2$, which is a half of a conventional art, with respect to the withstand voltage at 600 V.

In the present embodiment, the drain electrodes are arranged on the upper surface of the first n-type semiconductor layer in the same manner as in Embodiment 1. However, the drain electrode may be arranged at the lower surface side of the first n-type semiconductor layer in the same manner as in Embodiment 2. Further, the positions of the source electrodes and the drain electrodes are not limited to those shown in FIG. 5A. Furthermore, the material of the substrate is not limited to SiC and sapphire and may be Si, GaN, or the like. Moreover, the substrate is not limited to a single material and a substrate composed of plural materials such as SOI may be employed.

Embodiment 6

Next, Embodiment 6 of the present invention will be described.

Figure 6A:
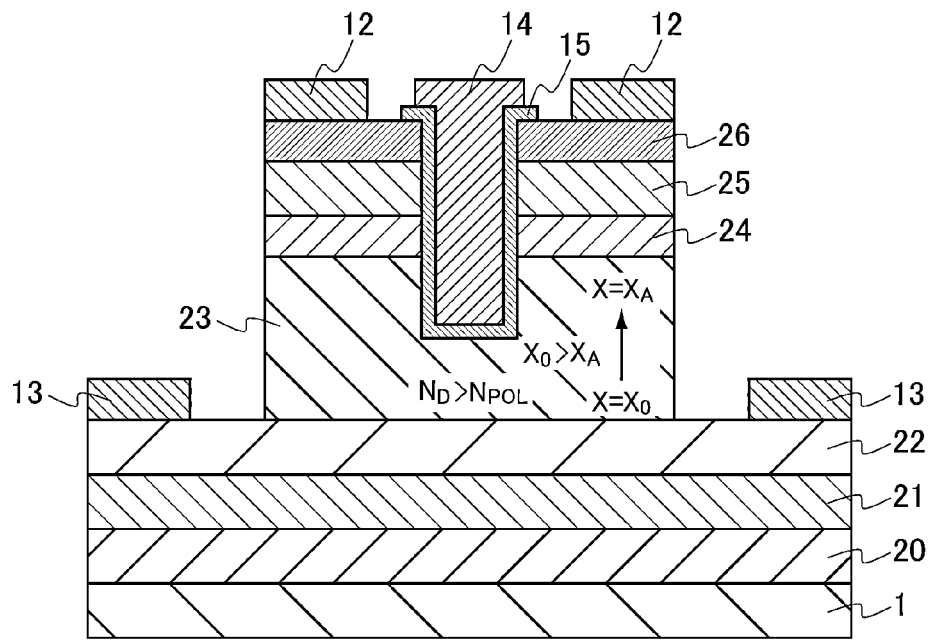
FIG. 6A is a cross sectional view showing the structure of the vertical transistor of Embodiment 6.

FIG. 6A is a cross sectional view showing the structure of the vertical transistor of the present embodiment. This vertical transistor has a structure similar to that of the vertical transistors of Embodiments 1, 3, 4 and 5 except that the way of change of the composition of the n-type $Al_xGa_{1-x}N$ layer 23 is different. In FIG. 6A, although the Al composition ratio x of the $Al_xGa_{1-x}N$ layer 23 decreases from the drain side toward the source side, the vertical transistor of the present embodiment is different from the vertical transistors of the aforementioned embodiments in the following points.

In the vertical transistors shown in Embodiments 1 and 2, the positive charge due to donor impurity is completely cancelled by the negative charge due to polarization charge. Although this configuration is most effective for improving the trade-off between the on-resistance and the withstand voltage, in order to perform the crystal growth by controlling the donor impurity concentration, the Al composition ratio, and the growth rate at the same time, a high level of the control technique is required. Even when the donor impurity concentration does not fully agree with the polarization charge density, if the positive charge at the time where the transistor is in the off-state is decreased by the negative charge due to polarization, the effect of increasing the withstand voltage can be achieved. In the present embodiment, $V_B$ (V) can be expressed by the following Equation (28) as a modification of the Equation (4).

[Equation 28]

$$V_B = \frac{\varepsilon_s E_{crit}^2}{2q(N_D - N_{POL})} - V_{bi} + \frac{kT}{q} \quad (28)$$

The on-resistance ($\Omega \cdot m^2$) at this time can be expressed by the following Equation (29) based on the Equation (6).

[Equation 29]

$$R_{on} = \frac{d_{min}}{qN_D\mu} \quad (29)$$

Here, the thickness $d_{min}$ (m) of the n-type $Al_xGa_{1-x}N$ layer 23 is given by the following Equation (30).

[Equation 30]

$$d_{min} = \frac{\varepsilon_s E_{crit}}{q(N_D - N_{POL})} \quad (30)$$

Figure 6B:
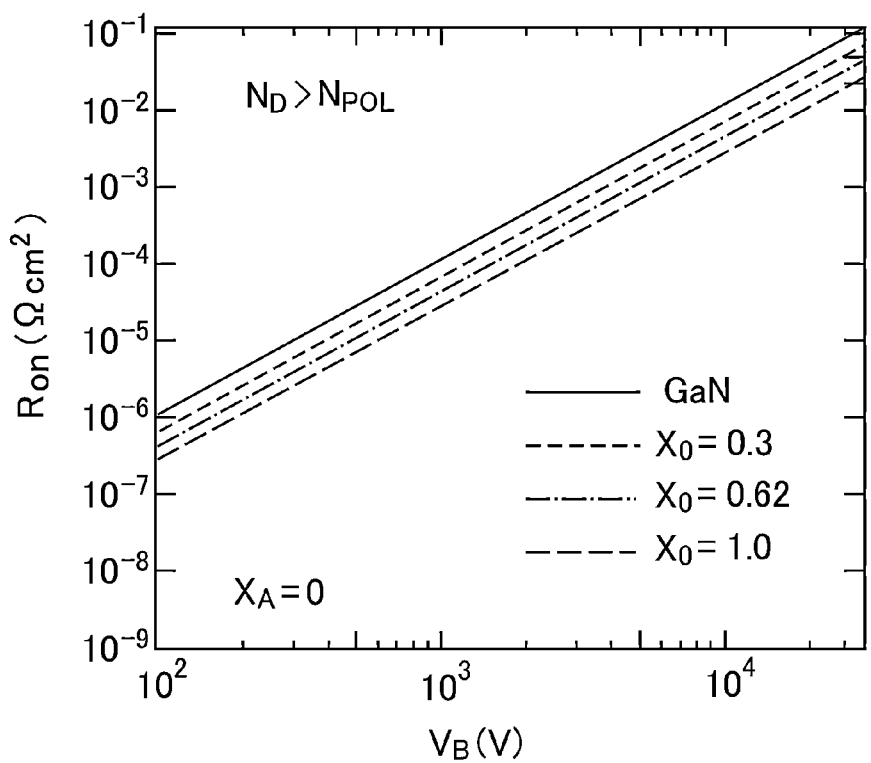
FIG. 6B is a graph showing the relationship between the onresistance and the withstand voltage in the vertical transistor of Embodiment 6 and the vertical transistor of Reference Example.

FIG. 6B is a graph showing results obtained by plotting the relationship between the on-resistance and the withstand voltage on the basis of the Equations (28), (29), and (30). In FIG. 6B, the vertical axis shows the on-resistance $R_{on}$ ($\Omega \cdot cm^{-2}$) and the horizontal axis shows the withstand voltage $V_B$ (V).

The solid line shows the plot in the case where the composition ratio is constant at x=0 (i.e., the GaN layer). Three dashed lines show plots of the $Al_xGa_{1-x}N$ layer in the cases where x is continuously decreased from the values of $x_0$ shown in FIG. 6B to $x_A$=0. As shown in FIG. 6B, in the vertical transistor of the present embodiment in which the composition is changed from $x_0$=0.3 to $x_A$=0, compared with the GaN layer shown by the solid line, the on-resistance at the same withstand voltage can be decreased to about 60%. The on-resistance at the same withstand voltage can be decreased to 40% of the GaN layer by further increasing a polarization charge with $x_0$=0.62 and can be decreased to a quarter of the GaN layer by generating a maximum polarization charge in this system with $x_0$=1.0. On the basis of the Equations (28), (29), and (30), the ratio of the donor impurity concentration to the volume density of the polarization charge with which the on-resistance shows the lowest value can be obtained. In other words, according to the Equations (28), (29), and (30), as compared to a conventional art, the on-resistance can be decreased, for example, by 20% if the donor impurity concentration is about 5 times the polarization charge density, and the on-resistance can be decreased, for example, by 40% if the donor impurity concentration is about 2.5 times the polarization charge density. From this reason, in the present invention, it is preferable that the donor impurity concentration ($m^{-3}$) of the second n-type semiconductor layer is not more than 5 times a maximum value $N_{POL}^{MAX}$ ($m^{-3}$) of the volume density of the polarization charge that can be generated in the second n-type semiconductor layer. Further, it is more preferable that the donor impurity concentration ($m^{-3}$) of the second n-type semiconductor layer is not more than 2.5 times a maximum value $N_{POL}^{MAX}$ ($m^{-3}$) of the volume density of the polarization charge that can be generated in the second n-type semiconductor layer. Ideally, the donor impurity concentration ($m^{-3}$) of the second n-type semiconductor layer is equal to a maximum value $N_{POL}^{MAX}$ ($m^{-3}$) of the volume density of the polarization charge that can be generated in the second n-type semiconductor layer.

The method of producing the vertical transistor of FIG. 6A is not limited and is, for example, as follows. First, a semiconductor is grown at the upper side of a sapphire substrate 1, for example, by the molecular beam epitaxy (MBE) growth method. The semiconductor layer formed in this manner has, for example, an undoped AlN buffer layer 20 (thickness: 20 nm), an undoped AlGaN buffer layer 21 (thickness: 2 μm), a high concentration n-type AlGaN layer 22 (thickness: 500 nm, doping concentration: $3 \times 10^{18}$ $cm^{-3}$, and Al composition ratio: 0.3), a graded composition n-type AlGaN layer 23 (thickness: 3.6 μm, doping concentration: $8.5 \times 10^{16}$ $cm^{-3}$, and Al composition ratio: 0.3→0), a p-type GaN layer 24 (thickness: 0.2 μm and doping concentration: $1 \times 10^{19}$ $cm^{-3}$), an n-type GaN layer 25 (thickness: 0.5 μm and doping concentration: $1 \times 10^{17}$ $cm^{-3}$), and a high concentration n-type GaN layer 26 (thickness: 0.2 μm and doping concentration: $1 \times 10^{18}$ $cm^{-3}$) from the substrate side in this order. Next, parts of the epitaxial structure are removed by etching until the n-type AlGaN layer 22 is exposed, drain electrodes 13 are formed by vapor deposition of metal such as Ti/Al, for example, at the upper side of the high concentration n-type AlGaN layer 22, and the drain electrodes 13 are brought into ohmic-contact with the high concentration n-type AlGaN layer 22 by annealing at 650° C. Then, source electrodes 12 are formed by vapor deposition of metal such as Ni/Au, for example, at the upper side of the high concentration n-type GaN layer 26. The gate electrode can be formed in the same manner as in the aforementioned embodiments. In this manner, the vertical transistor shown in FIG. 6A is produced. The vertical transistor produced in this manner can decrease the on-state resistance, for example, to $2.7 \times 10^{-5}$ $\Omega \cdot m^2$, which is 60% of a conventional art, with respect to the withstand voltage at 600 V.

In FIG. 6A, the drain electrodes are arranged on the upper surface of the first n-type semiconductor layer in the same manner as in Embodiment 1. However, the drain electrode may be arranged at the lower surface side of the first n-type semiconductor layer in the same manner as in Embodiment 2. Further, the positions of the source electrodes and the drain electrodes are not limited to those shown in FIG. 6A. Furthermore, the material of the substrate is not limited to SiC and sapphire and may be Si, GaN, or the like. Moreover, the substrate is not limited to a single material and a substrate composed of plural materials such as SOI may be employed.

Embodiment 7

Next, Embodiment 7 of the present invention will be described.

Figure 7:
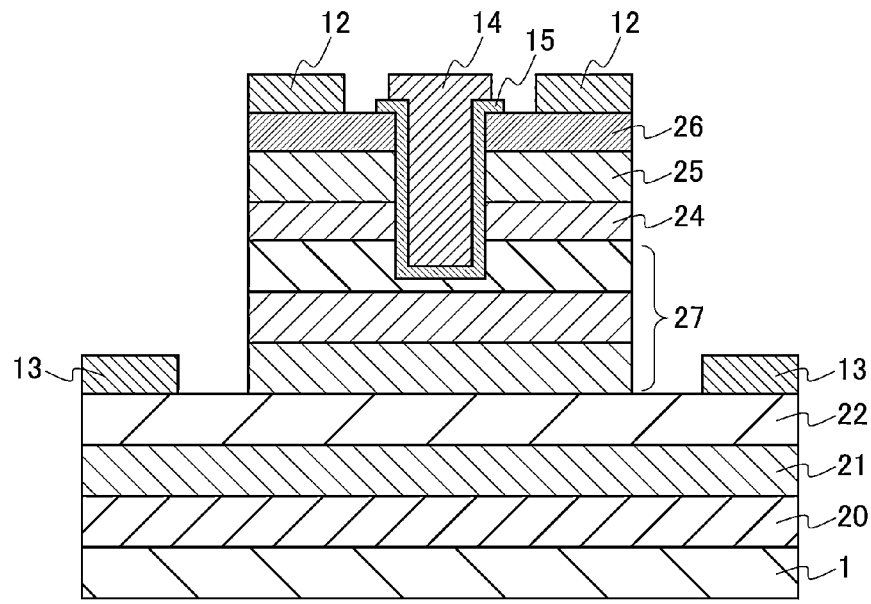
FIG. 7 is a cross sectional view showing the structure of the vertical transistor of Embodiment 7.

FIG. 7 is a cross sectional view showing the structure of the vertical transistor of the present embodiment. This vertical transistor has a structure similar to that of the vertical transistors of Embodiments 1, 3, 4, 5, and 6 except that the n-type $Al_xGa_{1-x}N$ layer 27 comprising three layers is used in place of the n-type $Al_xGa_{1-x}N$ layer 23. In FIG. 7, although the Al composition ratio x of the $Al_xGa_{1-x}N$ layer 27 decreases from the drain side toward the source side, the vertical transistor of the present embodiment is different from the vertical transistors of the aforementioned embodiments in the following points.

The $Al_xGa_{1-x}N$ layer 27 of FIG. 7 comprises three layers and the Al composition ratio changes from 0.3 at the source side in three stages, namely 0.2, 0.1, and 0. In this case, the differences of charges among the three layers can be calculated respectively as $4.74 \times 10^{12}$ $cm^{-2}$, $4.25 \times 10^{12}$ $cm^{-2}$, and $3.78 \times 10^{12}$ $cm^{-2}$ based on the Equation (13). Since this charge is unevenly distributed at the interface of each layer, the positive charge due to donor impurity remains at the time of reverse bias. Therefore, the performance comparable to that of the vertical transistor described in Embodiment 6 can be achieved.

The method of producing the vertical transistor of FIG. 7 is not particularly limited and is, for example, as follows. First, a semiconductor is grown at the upper side of a sapphire substrate 1, for example, by the molecular beam epitaxy (MBE) growth method. The semiconductor layer formed in this manner has, for example, an undoped AlN buffer layer 20 (thickness: 20 nm), an undoped AlGaN buffer layer 21 (thickness: 2 μm), a high concentration n-type AlGaN layer 22 (thickness: 500 nm, doping concentration: $3 \times 10^{18}$ $cm^{-3}$, and Al composition ratio: 0.3), a stepwise composition n-type AlGaN layer 27 (thickness: 3.6 μm, doping concentration: $8.5 \times 10^{16}$ $cm^{-3}$, and Al composition ratio: 0.3→0), a p-type GaN layer 24 (thickness: 0.2 μm and doping concentration: $1 \times 10^{19}$ $cm^{-3}$), an n-type GaN layer 25 (thickness: 0.5 μm and doping concentration: $1 \times 10^{17}$ $cm^{-3}$), and a high concentration n-type GaN layer 26 (thickness: 0.2 μm and doping concentration: $1 \times 10^{18}$ $cm^{-3}$) from the substrate side in this order. Next, parts of the epitaxial structure are removed by etching until the high concentration n-type AlGaN layer 22 is exposed, drain electrodes 13 are formed by vapor deposition of metal such as Ti/Al, for example, at the upper side of the high concentration n-type AlGaN layer 22, and the drain electrodes 13 are brought into ohmic-contact with the high concentration n-type AlGaN layer 22 by annealing at 650° C. Then, source electrodes 12 are formed by vapor deposition of metal such as Ni/Au, for example, at the upper side of the high concentration n-type GaN layer 26. The gate electrode can be formed in the same manner as in the aforementioned embodiments. In this manner, the vertical transistor shown in FIG. 7 is produced. The vertical transistor produced in this manner can decrease the on-state resistance, for example, to $2.7 \times 10^{-5}$ $\Omega \cdot m^2$, which is 60% of a conventional art, with respect to the withstand voltage at 600 V.

In the present embodiment, the drain electrodes are arranged on the upper surface of the first n-type semiconductor layer in the same manner as in Embodiment 1. However, the drain electrode may be arranged at the lower surface side of the first n-type semiconductor layer in the same manner as in Embodiment 2. Further, the positions of the source electrodes and the drain electrodes are not limited to those shown in FIG. 7. Furthermore, the material of the substrate is not limited to SiC and sapphire and may be Si, GaN, or the like. Moreover, the substrate is not limited to a single material and a substrate composed of plural materials such as SOI may be employed.

As described above, according to the semiconductor device of the present invention, the trade-off between the on-resistance and the withstand voltage can be improved beyond the physical limit by cancelling the positive charge due to donor impurity by the negative charge due to polarization.

The invention of the present application was described above with reference to the embodiments. However, the invention of the present application is not limited to the above-described embodiments. Various changes that can be understood by those skilled in the art can be made in the configurations and details of the invention of the present application within the scope of the invention of the present application.

This application claims priority from Japanese Patent Application No. 2009-201140 filed on Aug. 31, 2009. The entire subject matter of the Japanese Patent Application is incorporated herein by reference.

EXPLANATION OF REFERENCE NUMERALS 1 sapphire substrate
2 SiC substrate
12 source electrode
13 drain electrode
14 gate electrode
15 gate insulation film
20 buffer layer
21 AlGaN buffer layer
22 high concentration n-type AlGaN layer
23 graded composition n-type AlGaN layer
24 p-type GaN layer
25 n-type GaN layer
26 high concentration n-type GaN layer
27 multilayer n-type AlGaN layer
28 high concentration n-type GaN layer
29 n-type conductive substrate

The invention claimed is:
1. A semiconductor device comprises:
a substrate;
a first n-type semiconductor layer;
a second n-type semiconductor layer;
a p-type semiconductor layer;
a third n-type semiconductor layer;
a drain electrode;
a source electrode; and
a gate electrode, wherein the first n-type semiconductor layer, the second n-type semiconductor layer, the p-type semiconductor layer, and the third n-type semiconductor layer are laminated at the upper side of the substrate in this order, the drain electrode is in ohmic-contact with the first n-type semiconductor layer directly or via the substrate, the source electrode is in ohmic-contact with the third n-type semiconductor layer, an opening portion to be filled that extends from an upper surface of the third n-type semiconductor layer to an upper part of the second n-type semiconductor layer is formed at a part of the p-type semiconductor layer and a part of the third n-type semiconductor layer, the gate electrode is arranged so as to fill the opening portion to be filled and is in contact with an upper surface of the second n-type semiconductor layer, side surfaces of the p-type semiconductor layer, and side surfaces of the third n-type semiconductor layer at inner surfaces of the opening portion to be filled, and the second n-type semiconductor layer has composition that changes from a drain electrode side toward a source electrode side in a direction perpendicular to a plane of the substrate and contains donor impurity wherein the second n-type semiconductor layer has composition represented by $Al_xGa_{1-x}N$ ($0 \le x < 1$), and a relationship between an Al composition ratio at an interface at a first n-type semiconductor layer side $x_0$ ($>0$) and an Al composition interface at a p-type semiconductor layer side $x_A$ ($x_A \ge 0$) satisfies the following equation: $x_0 > x_A$.

2. The semiconductor device according to claim 1, further comprising a gate insulation film, wherein the gate insulation film is formed so as to cover the opening portion to be filled, and the gate electrode is in contact with the upper surface of the second n-type semiconductor layer, the side surfaces of the p-type semiconductor layer, and the side surfaces of the third n-type semiconductor layer via the gate insulation film.

3. The semiconductor device according to claim 1, wherein at least one of the first n-type semiconductor layer, the second n-type semiconductor layer, the p-type semiconductor layer, and the third n-type semiconductor layer is formed of a nitride semiconductor.

4. The semiconductor device according to claim 1, wherein an Al composition ratio x of the second n-type semiconductor layer decreases continuously from $x_0$ to $x_A$ from the drain electrode side toward the source electrode side in the direction perpendicular to the plane of the substrate.

5. The semiconductor device according to claim 1, wherein an Al composition ratio x of the second n-type semiconductor layer decreases in a stepwise manner from $x_0$ to $x_A$ from the drain electrode side toward the source electrode side in the direction perpendicular to the plane of the substrate.

6. The semiconductor device according to claim 4, wherein a decreasing gradient of the Al composition ratio of the second n-type semiconductor layer is a steep gradient from the drain electrode side toward the source electrode side.

7. The semiconductor device according to claim 6, wherein a volume density of a polarization charge that is generated in the second n-type semiconductor layer is uniform over the entire second n-type semiconductor layer.

8. The semiconductor device according to claim 7, wherein a donor impurity concentration ($m^{-3}$) of the second n-type semiconductor layer is equal to a maximum value $N_{POL}^{MAX}$ ($m^{-3}$) of a volume density of a polarization charge that can be generated in the second n-type semiconductor layer.

9. The semiconductor device according to claim 7, wherein a donor impurity concentration ($m^{-3}$) of the second n-type semiconductor layer is not more than 5 times a maximum value $N_{POL}^{MAX}$ ($m^{-3}$) of a volume density of a polarization charge that can be generated in the second n-type semiconductor layer.

10. The semiconductor device according to claim 8, wherein a donor impurity concentration ($m^{-3}$) of the second n-type semiconductor layer is not more than 2.5 times a maximum value $N_{POL}^{MAX}$ ($m^{-3}$) of a volume density of a polarization charge that can be generated in the second n-type semiconductor layer.

11. The semiconductor device according to claim 4, wherein a volume density of a polarization charge that is generated in the second n-type semiconductor layer decreases from the drain electrode side toward the source electrode side in the direction perpendicular to the plane of the substrate.

12. The semiconductor device according to claim 11, wherein a donor impurity concentration of the second n-type semiconductor layer decreases from the drain electrode side toward the source electrode side in the direction perpendicular to the plane of the substrate.

13. The semiconductor device according to claim 11, wherein the donor impurity concentration of the second n-type semiconductor layer is uniform over the entire second n-type semiconductor layer.

14. The semiconductor device according to claim 1, wherein the first n-type semiconductor layer and the third n-type semiconductor layer are each formed of plural n-type semiconductor layers.

15. The semiconductor device according to claim 1, wherein the opening portion to be filled is formed by removing a part of the p-type semiconductor layer and a part of the third n-type semiconductor layer.

16. The semiconductor device according to claim 1, wherein the semiconductor device is a field effect transistor.

17. The semiconductor device according to claim 1, wherein a first composition ratio at a first position of the second n-type semiconductor layer is larger than a second composition ratio at a second position of the second n-type semiconductor layer, and wherein a first distance between the first position and the drain side is smaller than a second distance between the second position and the drain side.

* * * * *

UNITED STATES PATENT AND TRADEMARK OFFICE
CERTIFICATE OF CORRECTION

PATENT NO. : 8,981,434 B2
APPLICATION NO. : 13/393002
DATED : March 17, 2015
INVENTOR(S) : Hironobu Miyamoto et al.

It is certified that error appears in the above-identified patent and that said Letters Patent is hereby corrected as shown below:

Claims

Column 25, Line 27: In Claim 1, delete "layer side $x_0>0$)" and insert -- layer side $x_0(x_0>0)$ --

Column 25, Line 28: In Claim 1, after "composition" insert -- ratio at an --

Column 26, Line 18: In Claim 10, delete "claim 8," and insert -- claim 7, --

Signed and Sealed this
Twenty-fourth Day of November, 2015

Michelle K. Lee
*Director of the United States Patent and Trademark Office*